US011981558B2

(12) United States Patent
Giusti et al.

(10) Patent No.: US 11,981,558 B2
(45) Date of Patent: May 14, 2024

(54) PIEZOELECTRIC ACTUATOR PROVIDED WITH A DEFORMABLE STRUCTURE HAVING IMPROVED MECHANICAL PROPERTIES AND FABRICATION METHOD THEREOF

(71) Applicant: STMICROELECTRONICS S.r.l., Agrate Brianza (IT)

(72) Inventors: Domenico Giusti, Caponago (IT); Marco Ferrera, Concorezzo (IT); Carlo Luigi Prelini, Seveso (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 485 days.

(21) Appl. No.: 17/240,782

(22) Filed: Apr. 26, 2021

(65) Prior Publication Data
US 2021/0347634 A1    Nov. 11, 2021

(30) Foreign Application Priority Data
May 7, 2020    (IT) ........................ 102020000010261

(51) Int. Cl.
*H04R 7/04*      (2006.01)
*B81B 3/00*      (2006.01)
(Continued)

(52) U.S. Cl.
CPC .......... *B81B 3/007* (2013.01); *B81C 1/00658* (2013.01); *F16K 31/005* (2013.01);
(Continued)

(58) Field of Classification Search
CPC ............ B81B 3/007; B81B 2201/0257; B81B 2201/054; B81B 2203/0127;
(Continued)

(56) References Cited

U.S. PATENT DOCUMENTS

| 5,473,215 A | 12/1995 | Luthier |
| 7,084,555 B2 | 8/2006 | Bachellerie et al. |

(Continued)

FOREIGN PATENT DOCUMENTS

| CN | 102183197 A | 9/2011 |
| CN | 108289270 A | 7/2018 |
| EP | 3 490 018 A1 | 5/2019 |

OTHER PUBLICATIONS

Muralt, P., "Ferroelectric thin films for micro-sensors and actuators: a review," *Journal of Micromechanics and Microengineering*, 2000, vol. 10, pp. 136-146.
(Continued)

*Primary Examiner* — Elias Ullah
(74) *Attorney, Agent, or Firm* — Seed IP Law Group LLP

(57) ABSTRACT

The MEMS actuator is formed by a body, which surrounds a cavity and by a deformable structure, which is suspended on the cavity and is formed by a movable portion and by a plurality of deformable elements. The deformable elements are arranged consecutively to each other, connect the movable portion to the body and are each subject to a deformation. The MEMS actuator further comprises at least one plurality of actuation structures, which are supported by the deformable elements and are configured to cause a translation of the movable portion greater than the deformation of each deformable element. The actuation structures each have a respective first piezoelectric region.

20 Claims, 21 Drawing Sheets

(51) Int. Cl.
*B81C 1/00* (2006.01)
*F16K 31/00* (2006.01)
*H04R 1/02* (2006.01)
*H04R 3/00* (2006.01)
*H04R 7/18* (2006.01)
*H04R 19/02* (2006.01)

(52) U.S. Cl.
CPC ................. *H04R 1/02* (2013.01); *H04R 3/00* (2013.01); *H04R 7/04* (2013.01); *H04R 7/18* (2013.01); *H04R 19/02* (2013.01); *B81B 2201/0257* (2013.01); *B81B 2201/054* (2013.01); *B81B 2203/0127* (2013.01); *B81B 2203/0315* (2013.01); *B81B 2203/0338* (2013.01); *B81B 2203/04* (2013.01); *B81B 2207/03* (2013.01); *H04R 2201/003* (2013.01)

(58) Field of Classification Search
CPC .... B81B 2203/0315; B81B 2203/0338; B81B 2203/04; B81B 2207/03; B81B 3/0037; B81B 2201/032; B81B 2203/053; B81C 1/00658; F16K 31/005; H04R 1/02; H04R 3/00; H04R 7/04; H04R 7/18; H04R 19/02; H04R 2201/003; H04R 17/00; H04R 31/00; H10N 30/1071; H10N 30/2044
See application file for complete search history.

(56) References Cited

U.S. PATENT DOCUMENTS

| | | |
|---|---|---|
| 10,433,063 B2 | 10/2019 | Rusconi Clerici Beltrami et al. |
| 2004/0036047 A1 | 2/2004 | Richter |
| 2004/0187927 A1 | 9/2004 | Kang et al. |
| 2007/0052765 A1 | 3/2007 | Yasui |
| 2008/0295308 A1 | 12/2008 | Wijngaards et al. |
| 2010/0181871 A1 | 7/2010 | Daniel et al. |
| 2010/0231659 A1 | 9/2010 | Ohta |
| 2011/0018944 A1 | 1/2011 | Yokoyama |
| 2013/0186078 A1 | 7/2013 | Lemke et al. |
| 2015/0333727 A1 | 11/2015 | Moulard et al. |
| 2017/0182778 A1 | 6/2017 | Cattaneo et al. |
| 2018/0124521 A1 | 5/2018 | Giusti et al. |
| 2018/0190895 A1 | 7/2018 | Giusti et al. |
| 2019/0329551 A1 | 10/2019 | Giusti et al. |
| 2020/0092655 A1 | 3/2020 | Jiang et al. |
| 2020/0194659 A1 | 6/2020 | Giusti et al. |
| 2020/0369023 A1 | 11/2020 | Giusti et al. |
| 2020/0369029 A1 | 11/2020 | Assanelli et al. |
| 2021/0347634 A1 | 11/2021 | Giusti et al. |
| 2021/0395075 A1 | 12/2021 | Giusti et al. |
| 2021/0405346 A1 | 12/2021 | Giusti et al. |

OTHER PUBLICATIONS

Schiffer, M. et al.; "MEMS Mass Flow Controller for Liquid Fuel Supply to HCCI-Driven Engine" Transducers Eurosensors IEEE 2019; 4 pages.
Bronkhorst® "Mass Flow Controller (MFC) Theory," downloaded on Dec. 17, 2020 from https://www.bronkhorst.com/service-support/technologies/mass-flow-controller-mfc-theory/.
U.S. Appl. No. 17/137,220, filed Dec. 29, 2020.

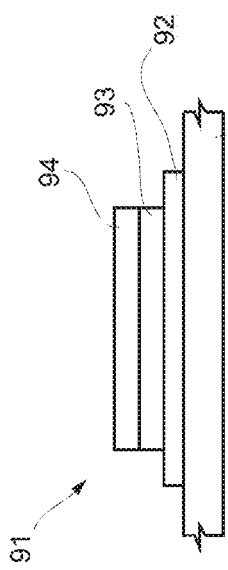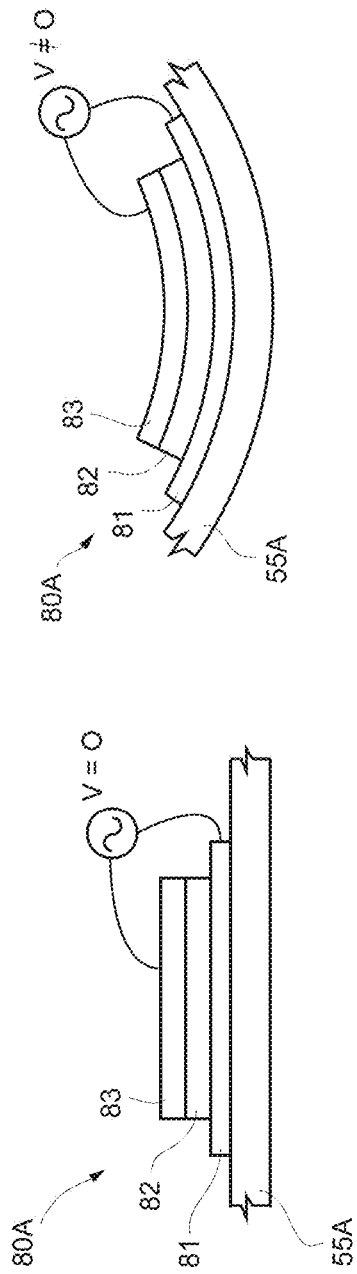

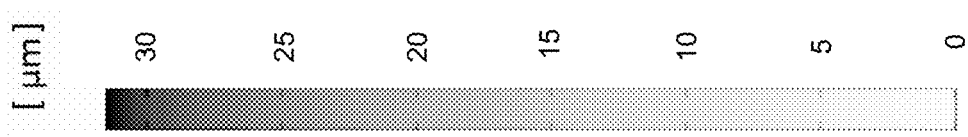
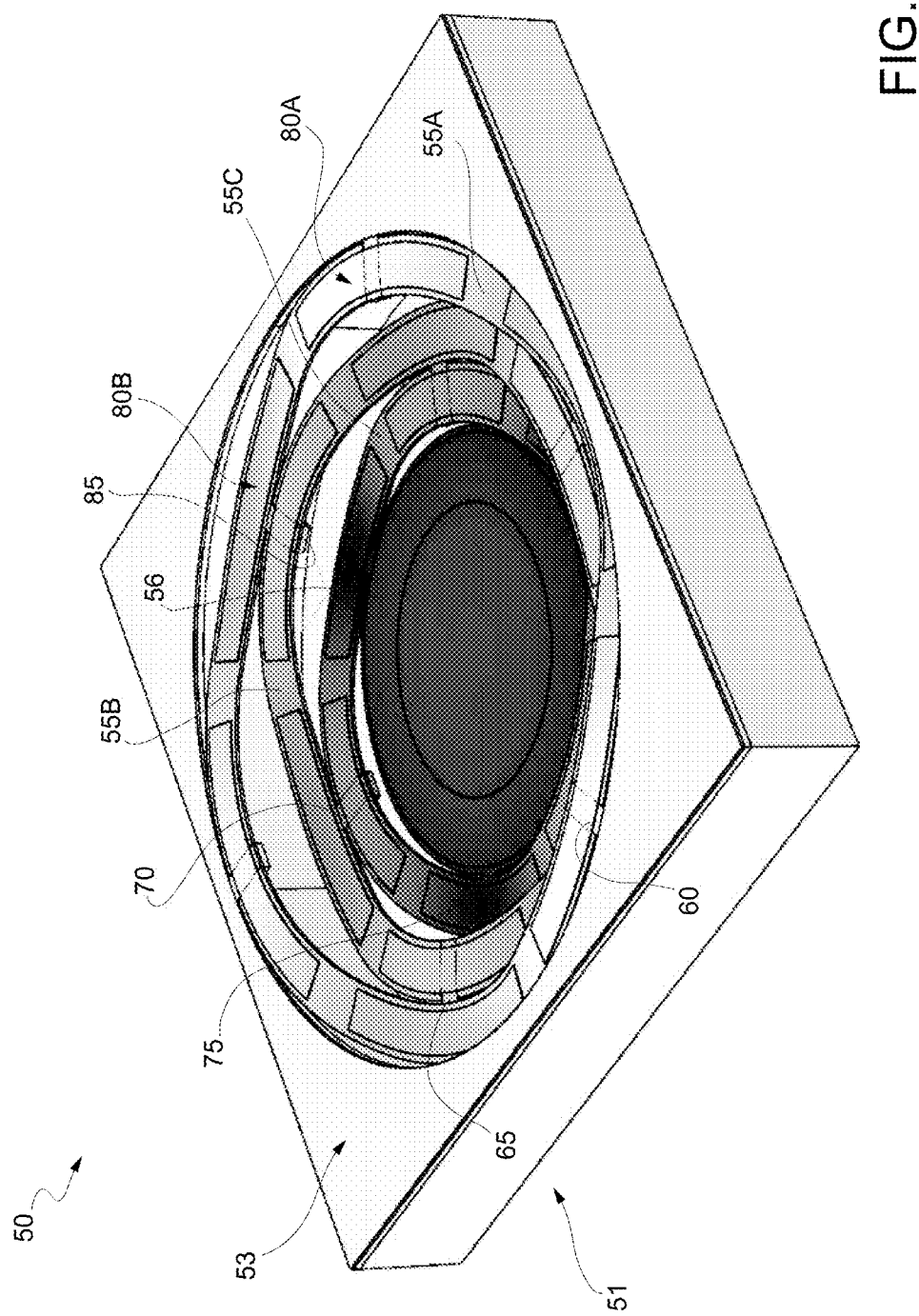
FIG. 6

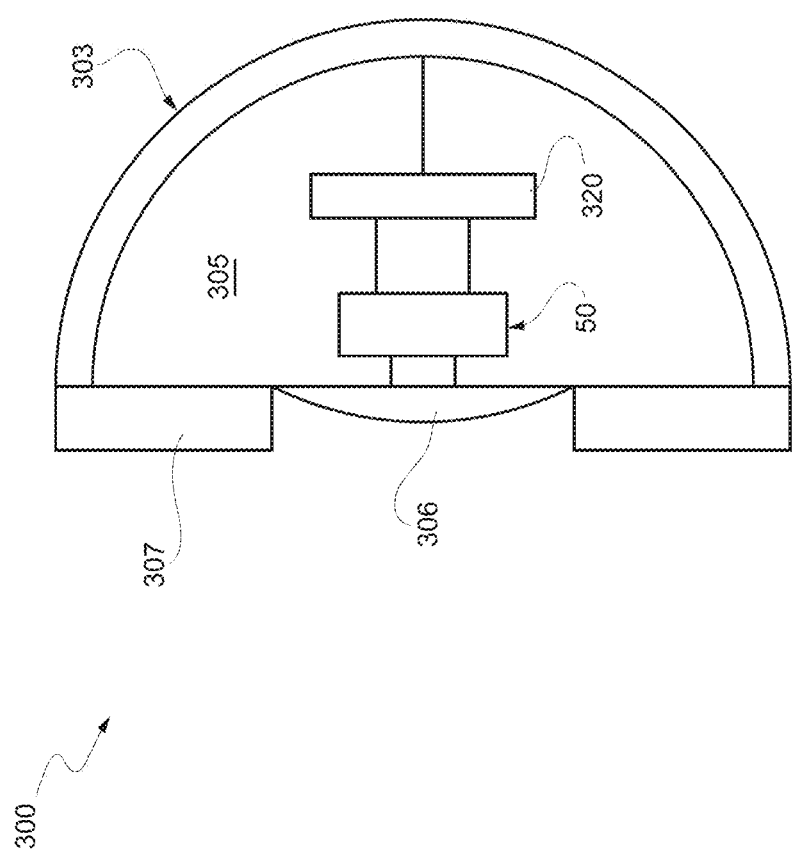

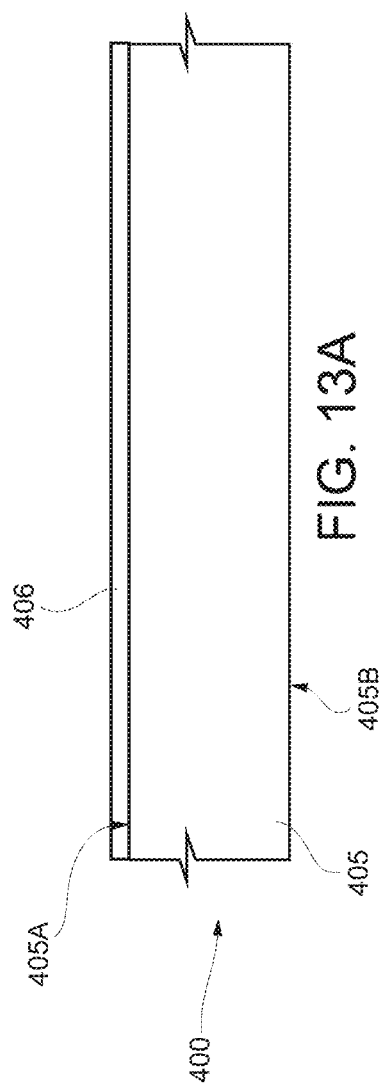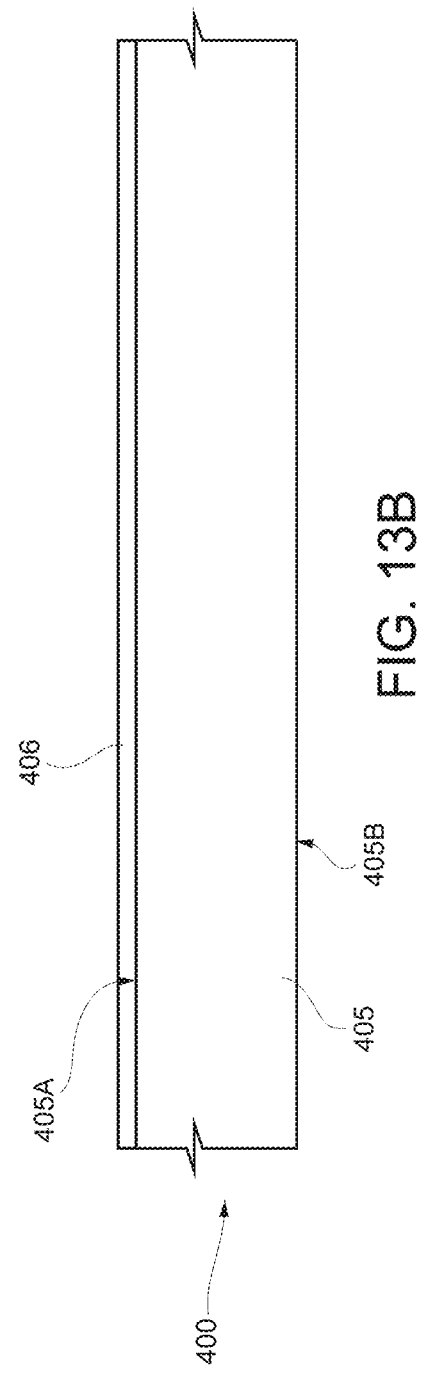

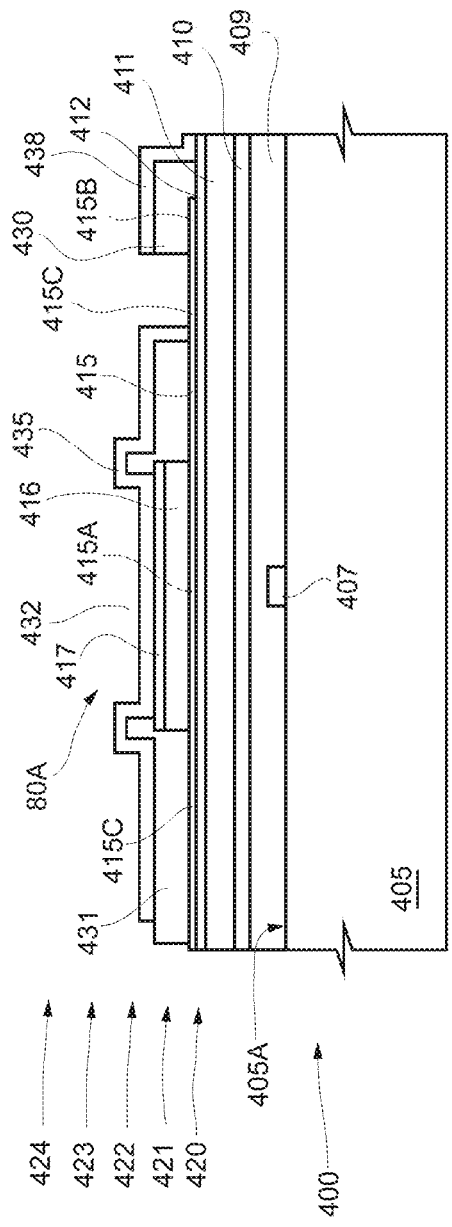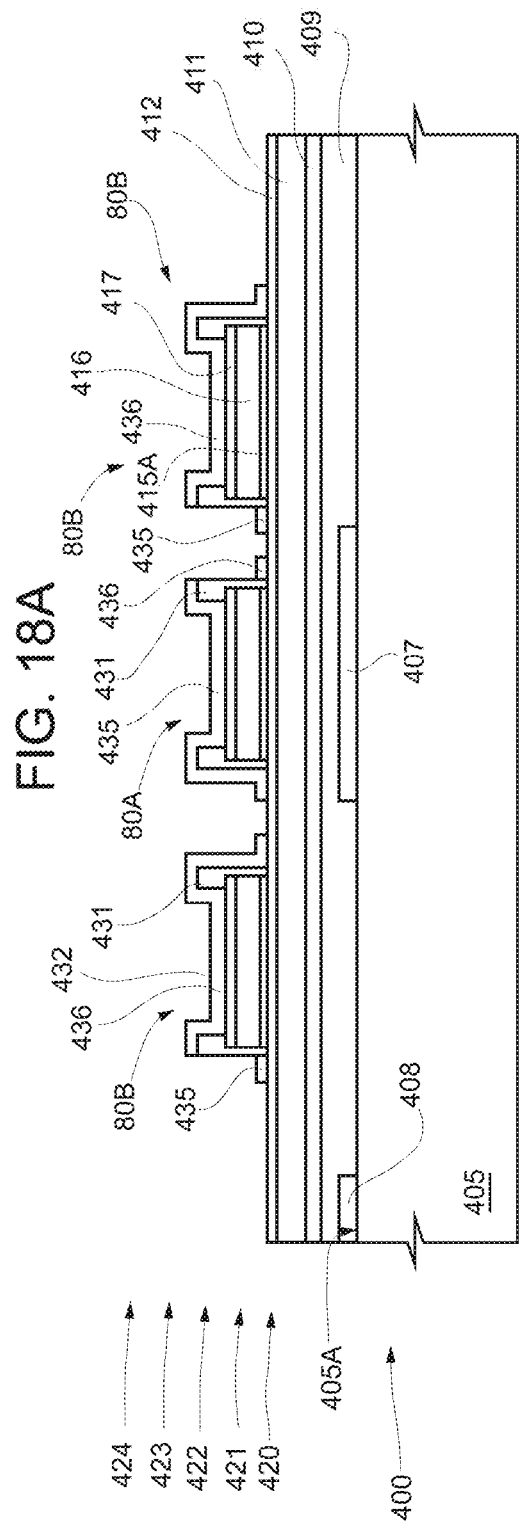

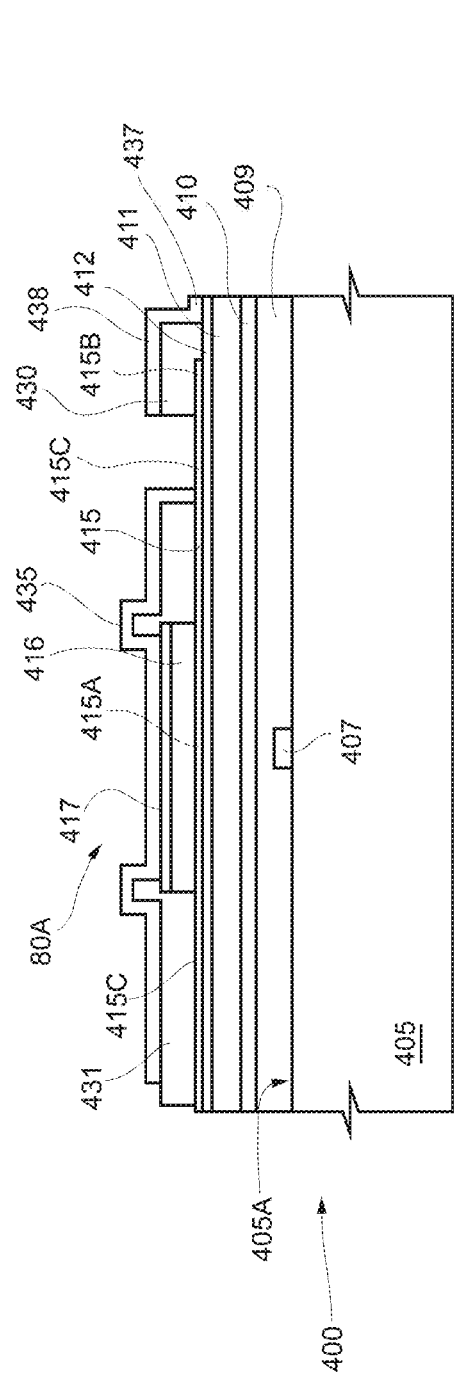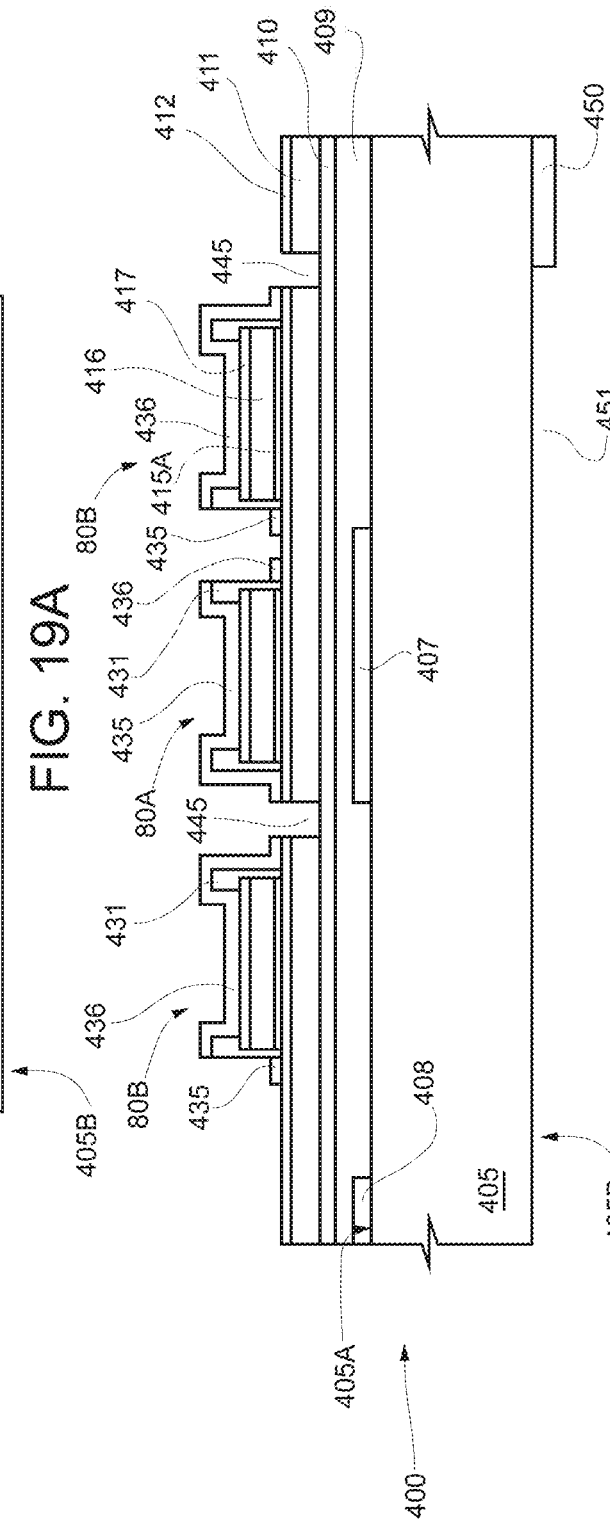

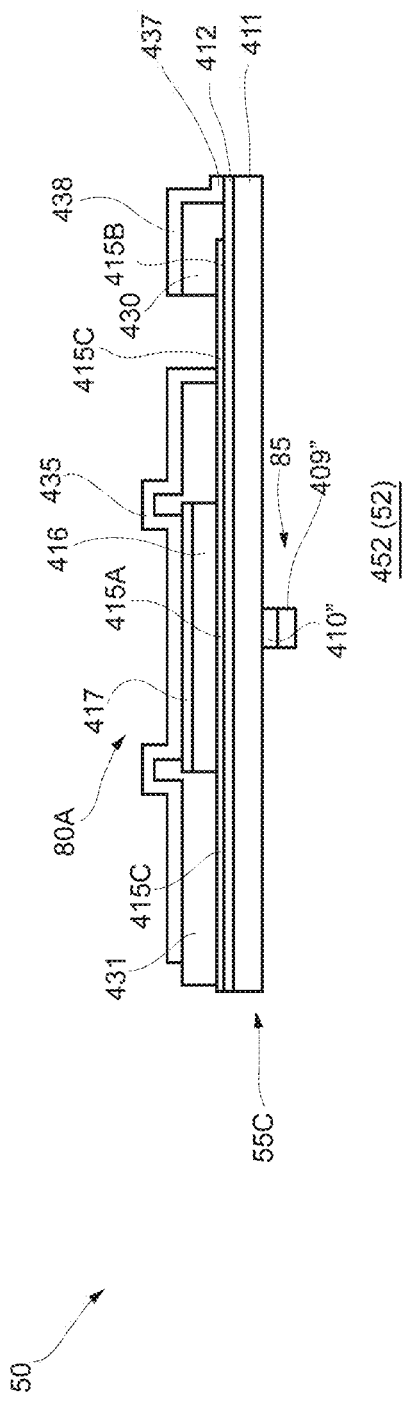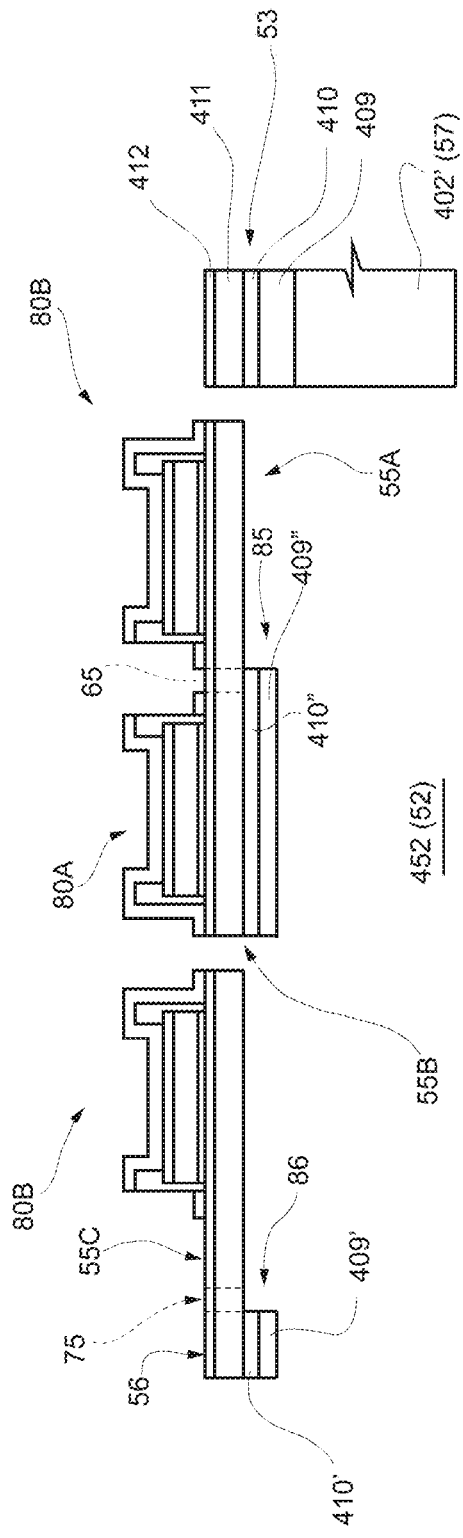

PIEZOELECTRIC ACTUATOR PROVIDED WITH A DEFORMABLE STRUCTURE HAVING IMPROVED MECHANICAL PROPERTIES AND FABRICATION METHOD THEREOF

BACKGROUND

Technical Field

The present disclosure relates to a piezoelectric actuator provided with a deformable structure having improved mechanical properties and to the fabrication method thereof. In particular, reference will be made to a piezoelectric actuator made using MEMS (Micro Electro-Mechanical System) technology such as a liquid flow control valve, a micro-spring for a speaker, a micro-mirror, a micro-tool such as micro-tweezers or micro-scissors.

Description of the Related Art

As known, a MEMS actuator is an electronic device typically made from a wafer of semiconductor material, for example silicon, capable of causing a deformation of a movable element such as a membrane or a cantilever.

A MEMS actuator may operate according to different actuation principles, including electrostatic, electromagnetic and piezoelectric actuation. In detail, MEMS actuators operating according to the piezoelectric actuation principle are distinguished by the high energy efficiency and the high deformation accuracy of the movable element; for this reason piezoelectric MEMS actuators are increasingly popular.

Furthermore, actuators having a piezoelectric actuation system are known which are used to make devices such as microfluidic valves used in flow regulation apparatuses, micro-mirrors and precision surgical tools.

Hereinafter, reference will be made, by way of example, to a flow regulator. A flow regulator is an apparatus allowing the amount of fluid flowing inside a fluidic channel to be controlled, and, which may be used, for example, at an industrial level to control process parameters of machinery for the fabrication of semiconductor devices.

Typically, a flow regulator comprises a fluidic channel, having an inlet port and an outlet port, a valve which regulates the amount of fluid flowing in the fluidic channel, a flowmeter which measures the fluid flow in the fluidic channel and a control unit.

BRIEF SUMMARY

The present disclosure discloses a piezoelectric actuator which overcomes the limitations of the known solutions, in particular which allows reduced dimensions and lower bias voltages with respect to the known solutions.

According to the present disclosure a piezoelectric actuator and a fabrication method thereof are provided.

At least one embodiment of a MEMS actuator of the present disclosure is directed to the MEMS actuator, including a body surrounding a cavity. A deformable structure on the cavity, the deformable structure including a movable portion and a plurality of deformable elements arranged consecutively. The plurality of deformable elements connects the movable portion to the body. The deformable structure further includes a plurality of arms coupling the movable portion, the plurality of deformable elements, and the body together. The deformable structure further includes a plurality of stiffening structures, respective ones of the plurality of stiffening structures being integral with respective ones of the plurality of arms. The MEMS actuator further including at least one plurality of actuation structures on the deformable elements.

At least one embodiment of a flow regulator of the present disclosure is directed to the flow regulator, including a channel body, a fluidic channel in the channel body and having an end portion and a passage section adjacent to the end portion. The flow regulator further including a microelectromechanical system (MEMS) actuator having a cavity, a body surrounding the cavity, and a deformable structure aligned with the cavity. The deformable structure including a movable portion having a surface facing the end portion and being configured to modify the passage section, which is arranged between the end portion and the movable portion. The deformable structure further including a plurality of deformable elements surrounding the movable portion, at least one plurality of actuation structures on the plurality of deformable elements, and at least one detection structures on the plurality of deformable elements. The flow regulator further including a control unit coupled to the MEMS actuator, the control unit configured to provide the at least one plurality of actuation structures with a bias voltage and to receive a detection voltage from the at least one detection structure.

At least one embodiment of a speaker of the present disclosure is directed to the speaker, including a shell delimiting a first cavity, a diaphragm attached to the shell and on the cavity, and a MEMS actuator. The MEMS actuator including a second cavity, a body surrounding the second cavity, and a deformable structure coupled to the diaphragm and configured to cause a deformation of the diaphragm. The deformable structure including a movable portion coupled to the diaphragm, a plurality of deformable elements surrounding the movable portion, at least one plurality of actuation structure on the plurality of deformable elements, and at least one detection structure on the plurality of deformable elements. The speaker further including a control unit coupled to the MEMS actuator and configured to provide the at least one plurality of actuation structures with a bias voltage and to receive a detection voltage from the at least one detection structure.

At least one embodiment of a method of the present disclosure is directed to fabricating a MEMS actuator, including forming at least one plurality of actuation structures on a first surface of a substrate opposite to a second surface of the substrate. Forming a deformable structure including forming a movable portion, forming a plurality of deformable elements arranged consecutively relative to each other and connecting one of the plurality of deformable elements to the movable portion, and forming a frame and connecting the frame to one of the plurality of deformable elements by forming a cavity extending into the second surface of the substrate.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIG. 2B is a cross-section of a deformation sensor of the piezoelectric actuator of FIG. 2A, at rest, taken along section line IIA-IIA of FIG. 4A;

FIG. 4B is a cross-secti-on of an actuation element of the piezoelectric actuator of FIG. 2A, at rest, taken along section line IVA-IVA of FIG. 4A;

FIG. 4C is a cross-section of the actuation element of FIG. 4B, in a deformed condition, taken along section line IVA-IVA of FIG. 4A;

FIG. 6 is a perspective view of the piezoelectric actuator of FIG. 2A according to a second use mode, in use;

FIG. 12 is a simplified perspective view of a speaker incorporating the present piezoelectric actuator; and FIGS. 13A-21A and 13B-21B show cross-sections of the piezoelectric actuator of FIG. 2A, in successive fabrication steps, taken along section lines XIIIA-XIIIA and XIIIB-XIIIB of FIG. 4A, respectively.

DETAILED DESCRIPTION

The present disclosure is directed to at least one embodiment of a piezoelectric actuator and at least one embodiment of a fabrication method thereof. The details of which will be discussed in further detail herein.

Figure 1:
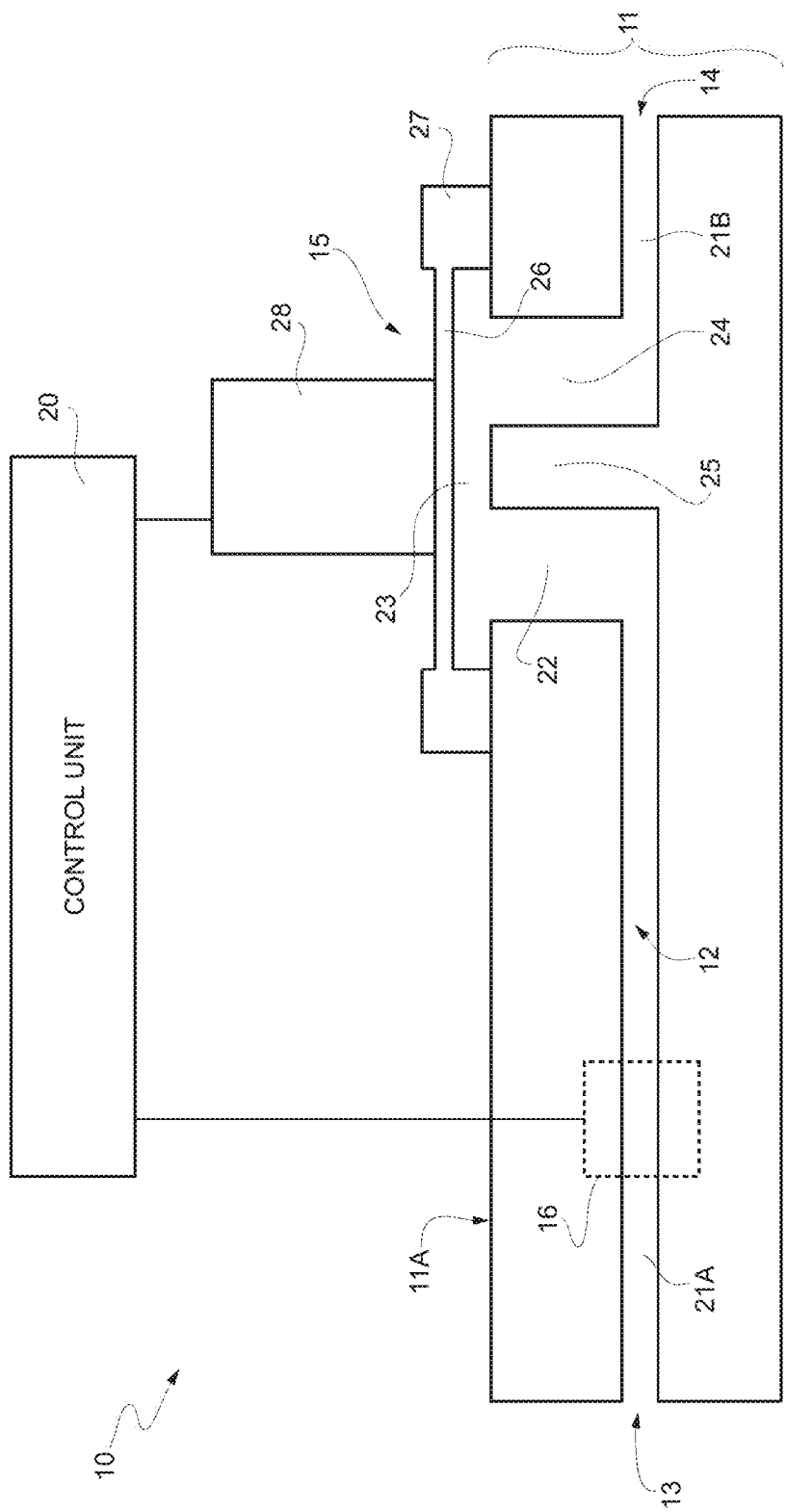
FIG. 1 is a cross-section of a known flow regulator.

FIG. 1 shows for example the structure of a known flow regulator 10 using piezoelectric actuation. The flow regulator 10 comprises a body 11; a fluidic channel 12 extending into the body 11 and having an inlet port 13 and an outlet port 14; a valve 15; a flowmeter 16; and a control unit 20.

The fluidic channel 12 comprises here a first and a second horizontal portion 21A, 21B, coupled to the inlet port 13 and the outlet port 14, respectively, through a first vertical portion 22, a passage 23 and a second vertical portion 24, consecutive to each other. The portions 21A, 21B, 22, 24 of the fluidic channel 12 are described as horizontal and vertical based on the orientation of the flow regulator 10 in FIG. 1.

The first vertical portion 22 extends here between the first horizontal portion 21A and a surface 11A of the body 11, at a zone of the valve 15, as explained below; the second vertical portion 24 extends here between the surface 11A of the body 11, in the zone of the valve 15, and the second horizontal portion 21B, and is separated from the first vertical portion 22 by means of a wall 25 of the body 11.

The flowmeter 16 is coupled to the first horizontal portion 21A of the fluidic channel 12 and to the control unit 20. The flowmeter 16 is configured to measure a quantity associated with the amount of fluid flowing in the fluidic channel 12. For example, the flowmeter 16 may comprise electrical resistances (not shown in FIG. 1) arranged along the fluidic channel 12 and having resistance related to the existing flow, in a known manner.

The valve 15 comprises a support 27 bonded to the body 11, a membrane 26 bonded to the support 27, and a piezoelectric actuation system 28 carried by the membrane 26.

In detail, the membrane 26 is formed for example by metal material, is constrained to the body 11 through the support 27 and is suspended on and facing the first and the second vertical portions 22, 24 and the wall 25, so to form with the latter the passage 23 of the fluidic channel 12.

The piezoelectric actuation system 28 is coupled to the control unit 20 and modifies the distance of the membrane 26 from the wall 25 to modify the flow.

In use, an amount, which may be a selected amount, of a fluid passes through the fluidic channel 12. In this regard, the control unit 20 applies a bias voltage to the piezoelectric actuation system 28 causing a deformation of the membrane 26.

Consequently, the section of the passage 23 varies, modifying the amount of fluid which flows in the fluidic channel 12.

In particular, the distance between the membrane 26 and the wall 25 may be continuously adjusted by modulating the bias voltage applied to the piezoelectric actuation system 28, thus the valve 15 may assume a plurality of operating states, ranging from a completely closed state to a completely open state, corresponding to a null and a maximum amount of fluid, respectively, proportionally to the value of the bias voltage.

Simultaneously, the control unit 20 measures the fluid flow in the fluidic channel 12 and may control the opening degree of the valve 15 on the basis of the measured flow.

However, the flow regulator 10 as shown in FIG. 1 has disadvantages.

For example, the flow regulator 10 has large dimensions relative to embodiments of flow regulators of the present disclosure. In fact, the flowmeter 16 is placed at a distance from the valve 15.

Furthermore, the piezoelectric actuation system 28 has large dimensions. For example, being made using the bulk technique, the piezoelectric mass may have a thickness of even a few millimeters. Consequently, the actuation system 28 is not suitable for applications wherein a high miniaturization is beneficial.

Furthermore, the piezoelectric actuation system 28 includes high bias voltages, even of a few hundred volts, in order to obtain deformations of tens of micrometers. Such high bias voltages may utilize complex and expensive integration procedures in the aforementioned apparatuses and may be a danger for a user of the flow regulator 10.

In addition, the flow regulator 10 has low energy efficiency, since the flowmeter 16 performs an active detection of the fluid flow, i.e., through a passage of current. Therefore, it consumes a lot of energy.

The present disclosure is directed to embodiments of a piezoelectric actuator made using thin piezoelectric film MEMS (Micro Electro-Mechanical System) technology is described herein. For example, the piezoelectric actuator 50 is made using thin piezoelectric film MEMS technology as described herein.

Figure 2A:
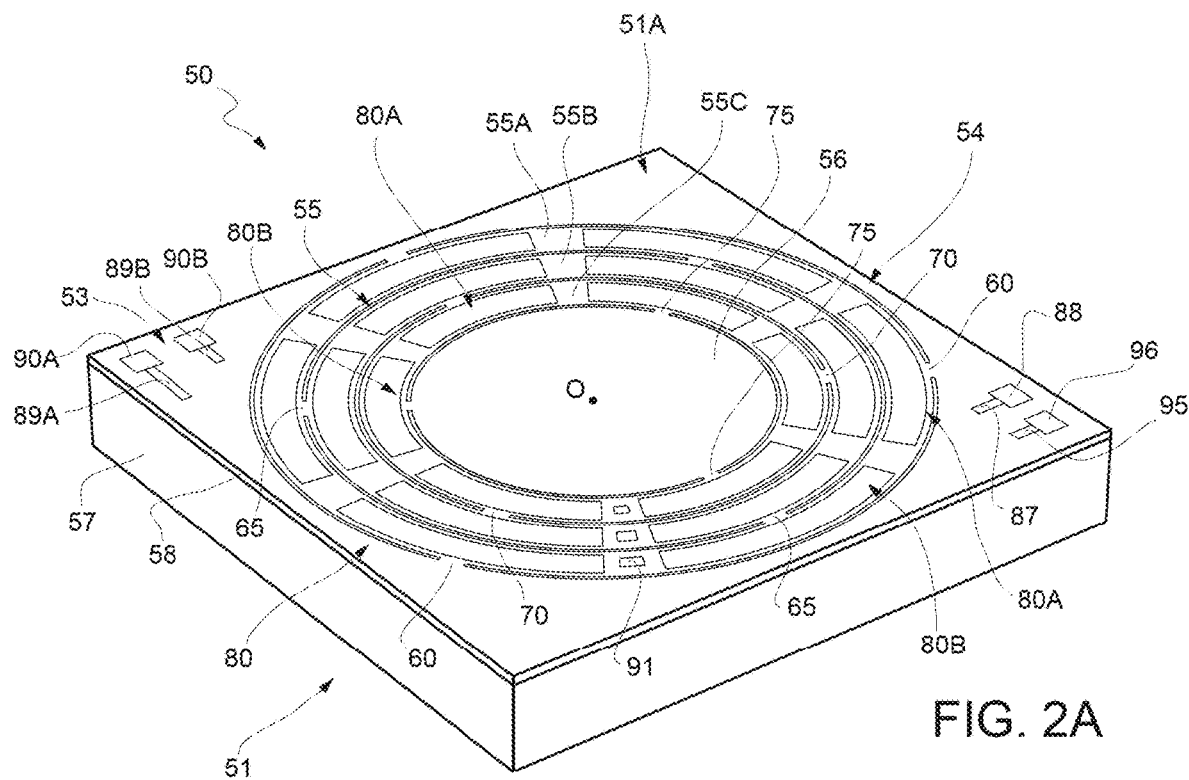
FIG. 2A is a perspective view from above of an embodiment of the present piezoelectric actuator.
Figure 3:
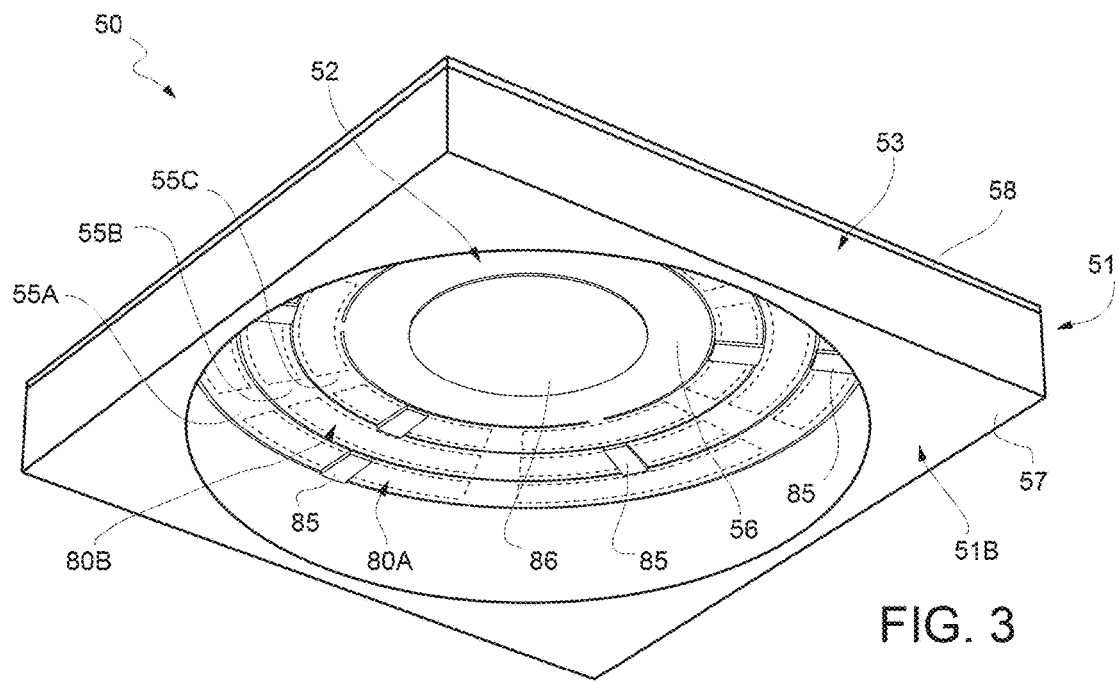
FIG. 3 is a perspective view from below of the piezoelectric actuator of FIG. 2A.
Figure 4A:
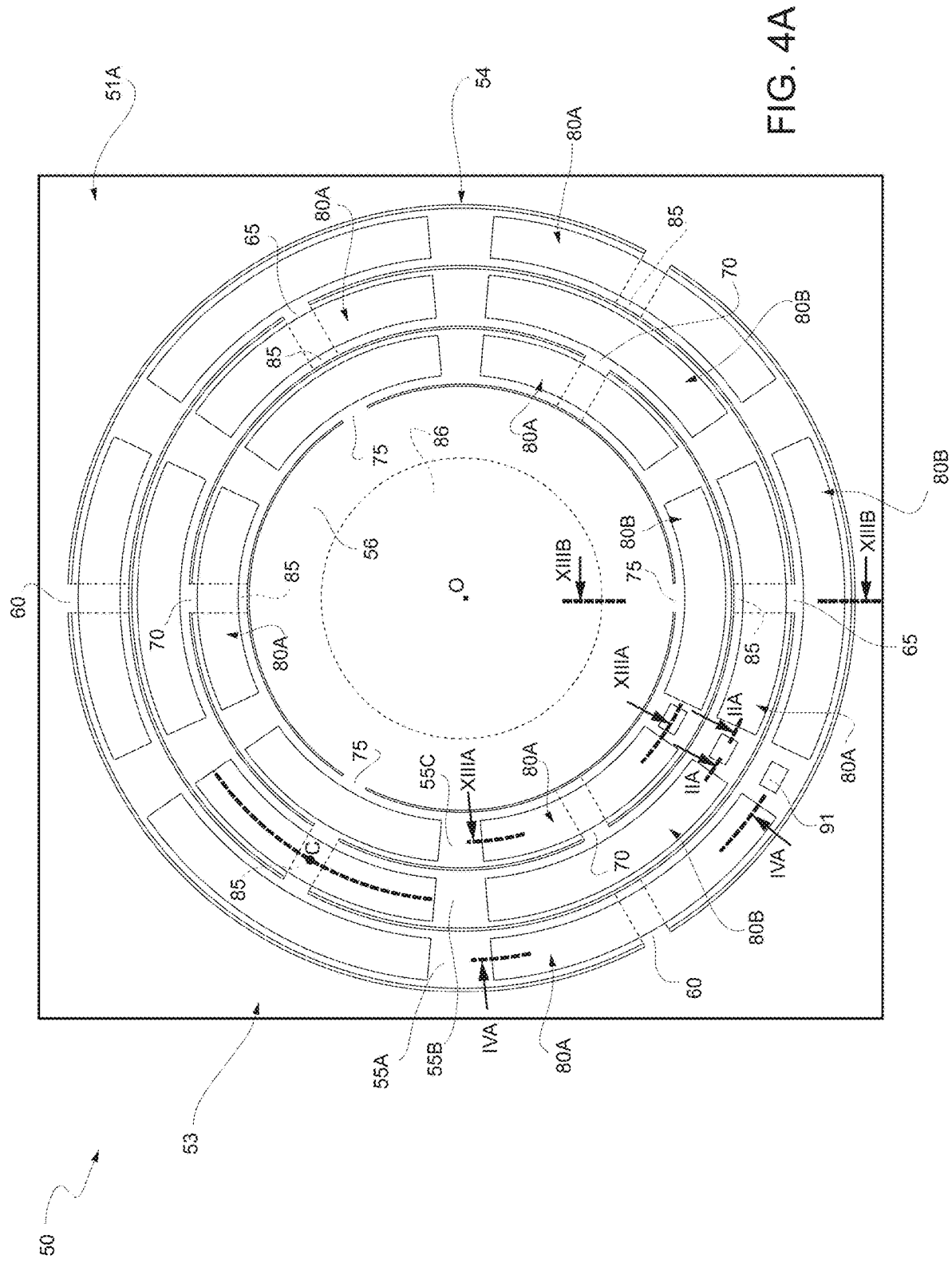
FIG. 4A is a top view of the piezoelectric actuator of FIG. 2A.

As shown in FIGS. 2A, 3, and 4A, the piezoelectric actuator 50 is formed in a body 51 having a first face or surface 51A and a second face or surface 51B and comprising a substrate 57 of semiconductor material, for example silicon, and a superficial layer 58 overlying the substrate 57 and for example formed by a plurality of single layers such as a layer of semiconductor material, for example polysilicon, and at least one layer of insulating material, such as tetraethyl orthosilicate (TEOS).

A cavity 52, for example of cylindrical shape, extends inside the body 51 from the second face 51B and passes through the body 51 completely. Consequently, the substrate 57 and the portion of the superficial layer 58 there above form a frame 53 surrounding a deformable structure 54, formed here by the same materials, which form the superficial layer 58 and are suspended on the cavity 52.

The superficial layer 58 is much thinner than the substrate 57 and than the horizontal extension, which is substantially parallel to the first face 51A of the body 51, of the deformable structure 54.

Therefore, the deformable structure 54 is substantially planar.

The deformable structure 54 has, in plan, a symmetry, for example a circular symmetry or a polygonal with a large number of sides symmetry, having a center O, and comprises a plurality of deformable rings 55, concentric with each another, and a movable central portion 56 surrounded by the deformable rings 55 and having here, in plan, a circular section.

In particular, in this embodiment, the deformable structure 54 is formed by three deformable rings comprising a first, a second and a third deformable ring 55A-55C.

The first ring 55A is coupled to the frame 53 through a plurality of first connection portions 60. Each first connection portion 60 is suspended on and overlaps the cavity 52, and each first connection portion 60 extends between the frame 53 and the first deformable ring 55A, forming a single piece (or being monolithic) therewith.

In detail, here, there are three first connection portions 60, reciprocally spaced by 120° along the circumference of the first deformable ring 55A.

The second deformable ring 55B is arranged internally with respect to the first deformable ring 55A such that the first deformable ring 55A surrounds the second deformable ring 55B. The second deformable ring 55B is coupled to the first deformable ring 55A through a plurality of second connection portions 65. Each second connection portion 65 is suspended on and overlaps with the cavity 52, and each second connection portion 65 extends between the first and the second deformable rings 55A, 55B, forming a single piece therewith.

In detail, here, there are three second connection portions 65, reciprocally spaced by 120° along the circumference of the second deformable ring 55B and having, in this embodiment, an offset of 60° with respect to the first connection portions 60.

The third deformable ring 55C is arranged internally with respect to the second deformable ring 55B and is coupled to the second deformable ring 55B through a plurality of third connection portions 70. Each third connection portion 70 is suspended on and overlaps with the cavity 52, and extends between the second and the third deformable rings 55B, 55C, forming a single piece therewith.

In detail, here, there are three third connection portions 70, reciprocally spaced by 120° along the circumference of the third deformable ring 55C and having, in this embodiment, an offset of 60° with respect to the second connection portions 65. In other words, the third connection portions 70 have zero offset with respect to corresponding ones of the first connection portions 60 and are radially aligned with corresponding ones of the first connection portions 60.

The third deformable ring 55C is also coupled to the movable central portion 56 through a plurality of fourth connection portions 75. Each fourth connection portion 75 is suspended on the cavity 52 and extends between the third deformable ring 55C and the movable central portion 56, forming a single piece therewith.

In detail, here, there are three fourth connection portions 75, reciprocally spaced by 120° along the circumference of the third ring 55C and having, in this embodiment, an offset of 60° with respect to the third connection portions 70. In other words, the fourth connection portions 75 have zero offset with respect to corresponding ones of the second connection portions 65 and are radially aligned with corresponding ones of the second connection portions 65.

The first, the second and the third deformable rings 55A-55C carry a respective plurality of actuation structures 80, equal in number to each other, of curved-strip shape, operatively divided into first and second group actuation structures 80A, 80B and placed at a distance from each other.

Each actuation structure 80 (see FIG. 4B as regards a first group actuation structure 80A) is formed by a stack comprising a lower actuation electrode 81, which is made of a conductive material, for example platinum; a piezoelectric actuation region 82, for example of a unimorph ceramic material having high relative dielectric permittivity, for example greater than 100, such as lead zirconate titanate (PZT), $BaTiO_3$, KNN (potassium sodium niobate), $PbTiO_2$ or $PbNb_2O_6$; and an upper actuation electrode 83, which is made of a conductive material, for example platinum, iridium oxide, yttrium or a titanium-tungsten alloy. The piezoelectric actuation region 82 is arranged between the upper actuation electrode 83 and the lower actuation electrode 81, so as to form a capacitor structure.

In detail, here, the lower actuation electrode 81 of all the actuation structures 80 is formed by a single conductive region (not visible in FIG. 2A) comprising a connection portion 87 (only partially visible here) for the connection to a lower electrode pad 88, for the electrical connection to an external biasing electric circuit, not shown, for example to a reference potential (ground).

The upper actuation electrodes 83 of the first group actuation structures 80A are connected through a first conductive connection track 89A (only partially visible here) to a respective first group upper electrode pad 90A, for the electrical connection to the external biasing electric circuit.

The upper actuation electrodes 83 of the second group actuation structures 80B are connected through a second conductive connection track 89B (only partially visible here) to a respective second group upper electrode pad 90B, for the electrical connection to the external biasing electric circuit.

In this embodiment, the first, the second and the third deformable rings 55A-55C each carry six actuation structures 80. The curved strips which form the actuation structures 80 each cover a substantially equal circumference arc and have a center C placed on a median line, which is defined here by a circle arc and represented by a dashed line in FIG. 4A passing through the center C near the left-hand side of FIG. 4A based on the orientation of the piezoelectric actuator 50 in FIG. 4A. The center C of each actuation structure 80 is equidistant from the center C of a respective adjacent actuation structure 80. In other words, the centers C of the actuation structures 80 are reciprocally spaced by 60° along the circumference of a respective deformable ring 55 and the actuation structures 80 of each deformable ring 55A-55C have equal length and are radially aligned with the actuation structures 80 of the adjacent deformable rings 55A-55C.

The first and second group actuation structures 80A, 80B are arranged alternately in succession in each deformable ring 55A-55C; in particular, the centers C of the second group actuation structures 80B are reciprocally spaced by 120° along the circumference of a respective deformable ring 55, and have an offset of 60° with respect to the center C of a respective adjacent first group actuation structure 80A of the same deformable ring 55.

Furthermore, the centers C of the first group actuation structures 80A of the first deformable ring 55A have an offset of 60° with respect to the centers C of the first group actuation structures 80A of the second deformable ring 55B and a zero offset with respect to the centers C of the first group actuation structures 80A of the third deformable ring 55C (in other words, they are radially aligned therewith).

Furthermore, the deformable rings 55A-55C carry a plurality of stiffening structures 85 (FIGS. 3 and 4A), extending from the lower side of the deformable rings 55, towards the inside of the cavity 52. The stiffening structures 85, one for each first group actuation structure 80A, extend radially, each aligned with the center C of the respective first group actuation structure 80A, and on the lower side of a respective connection portion; therefore, each stiffening structure 85 has a width, in a radial direction, substantially equal to the sum of the width of the respective deformable ring 55 and of a respective connection portion.

The stiffening structures 85 are a single piece (or monolithic) with a respective connection portion (as hereinafter explained with reference to the fabrication method) and therefore are integral with the respective connection portion.

In practice, the stiffening structures 85 and the respective connection portions work, in use, as pivot structures, as hereinafter explained in detail.

In this embodiment, the deformable rings 55A-55C each carry three stiffening structures 85, reciprocally spaced by 120° along the circumference of a respective deformable ring 55. In detail, as regards the first deformable ring 55A, each stiffening structure 85 is integral with a respective first connection portion 60; as regards the second deformable ring 55B, each stiffening structure 85 is integral with a respective second connection portion 65; and as regards the third deformable ring 55C, each stiffening structure 85 is integral with a respective third connection portion 70.

Furthermore, the movable central portion 56 carries a shutter structure 86 (FIGS. 3 and 4A), formed here in the same layer as the stiffening structures 85, extending below the movable central portion 56 towards the inside of the cavity 52. Here, the shutter structure 86 has, in plan, a circular section having a diameter smaller than or substantially equal to the section of the movable central portion 56. The shutter structure 86 has a region protruding from the movable central portion 56 towards and into the cavity 52. The moveable central portion 56 may be a platform suspended on and overlapping with the cavity 52.

The deformable structure 54 also accommodates a plurality of deformation sensors, of which three deformation sensors 91 are shown in FIG. 2A. The deformation sensor 91 may be a detection structure or some other similar or like sensor.

The deformation sensors 91 are each carried by a respective deformable ring 55 and are each arranged between two adjacent actuation structures 80. In particular, in this embodiment, the deformable rings 55A-55C each carry a deformation sensor 91.

The deformation sensors 91 are each formed by a respective stack comprising a lower detection electrode 92, which is made of a conductive material, for example platinum, a piezoelectric detection region 93, for example of a material having a low relative electrical permittivity, for example approximately lower than or substantially equal to 10, and a loss tangent for example lower than 0.05, in particular substantially equal to 0.002, such as aluminum nitride, zinc oxide or polyvinylidene fluoride (PVDF), here of aluminum nitride, and an upper detection electrode 94, of conductive material, for example molybdenum, platinum, iridium oxide or yttrium. The piezoelectric detection region 93 is arranged between the upper detection electrode 94 and the lower detection electrode 92, so as to form a capacitor structure, as shown in FIG. 2B.

The lower detection electrode 92 of each deformation sensor 91 is formed, in this embodiment, by the same single conductive region that forms the lower actuation electrodes 81 of all the actuation structures 80. Furthermore, a third conductive connection track 95, only partially shown here, connects the upper detection electrodes 94 to a detection pad 96 (see FIG. 2A), for the electrical connection to an external measure circuit, not shown.

The deformable structure 54 may form, for example, a shutter of a normally-closed or normally-open valve structure, which is controlled to be in complete opening or complete closing or in flow modulation, as explained in detail hereinafter.

Specifically, in use, in the absence of bias, the piezoelectric actuator 50 is in the position shown in FIGS. 2A, 3, and 4A, with the upper surface of the movable central portion 56 being level with the first face 51A of the body 51. In other words, when the piezoelectric actuator 50 is at rest, upper surfaces of the movable central portion 56, the deformable elements 55A, 55B, 55C of the deformable structure 55, and the body 51 are substantially coplanar with each other in a plane such that the upper surfaces are aligned with each other.

To move the movable central portion 56 away from or towards the cavity 52, a bias voltage is selectively applied between the upper electrodes and the lower electrodes 83, 81, respectively, of the actuation structures 80, as explained hereinafter. In particular, the bias voltage causes a deformation of the piezoelectric actuation regions 82, as shown for example in FIG. 4C for a first group actuation structure 80A. In fact, regardless of the bias voltage polarity, the piezoelectric actuation region 82 is subject to an equal warping deformation, wherein a central portion of the actuation structure 80 lowers with respect to the side portions of the same actuation structure 80.

However, the different position of the first group actuation structures 80A, whose central portions are constrained by the first, second and third connection portions 60, 65 and 70 and by the stiffening structures 85, with respect to the second group actuation structures 80B, determines a different deformation of the deformable rings 55 depending on whether the first group actuation structures 80A or the second group actuation structures 80B are biased, as described in detail hereinafter.

Figure 5:
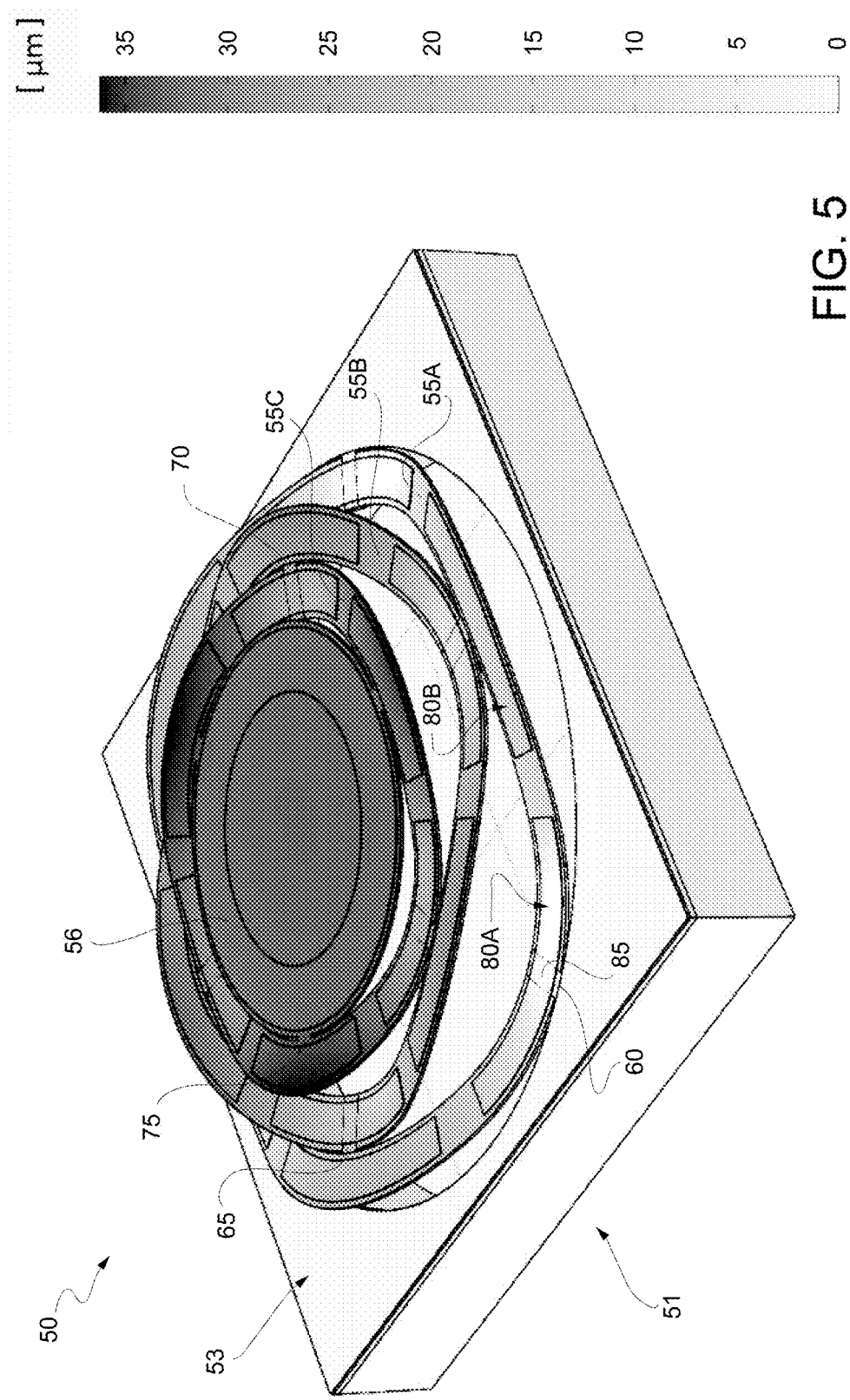
FIG. 5 is a perspective view of the piezoelectric actuator of FIG. 2A according to a first use mode, in use.

In FIG. 5, a bias voltage V1, in particular a positive unipolar bias voltage, for example of 40 V, is applied to the first group actuation structures 80A, while the second group actuation structures 80B are not biased (V2=0 V).

In this bias condition, each first group actuation structure 80A deforms approximately as shown in FIG. 4C for the first deformable ring 55A.

As noted, in the first deformable ring 55A, the central portions of the first group actuation structures 80A are constrained to the frame 53 through the first connection portions 60 and respective stiffening structures 85, therefore remaining nearly undeformed; conversely, the end portions of the first group actuation structures 80A are lifted upwards.

Lifting the end portions of the first group actuation structures 80A causes also the lifting of the adjacent second group actuation structures 80B of the first deformable ring 55A.

Furthermore, since the central portions of the first group actuation structures 80A of the second deformable ring 55B are constrained to the central portions of the second group actuation structures 80B of the first deformable ring 55A (through the second connection portions 65 and respective stiffening structures 85), they are lifted, thus lifting, for this reason, the internal deformable rings (second and third deformable rings 55B, 55C). Furthermore, the first group actuation structures 80A of the second deformable ring 55B deform similarly to what described hereinabove, causing a further lifting of the second group actuation structures 80B of the second deformable ring 55B and thus of the third deformable ring 55C.

Similarly, the first group actuation structures 80A of the third deformable ring 55C deform and cause a further lifting of the second group actuation structures 80B of the third deformable ring 55C and thus of the movable central portion 56, as shown in FIG. 5, wherein the piezoelectric actuator 50 is represented in gray scale, wherein the darker portions are the ones more deformed with respect to the rest position.

In FIG. 6, the bias voltage, in particular positive unipolar as previously said, is applied to the second group actuation structures 80B. Here again, the piezoelectric actuator 50 is represented in gray scale, wherein a darker shade corresponds to a greater deformation with respect to the rest position.

In this case, the second group actuation structures 80B of the first deformable ring 55A deform, as shown in FIG. 4C, and cause a downward displacement of the central portions thereof, towards the inside of the cavity 52, with respect to the end portions thereof, which are instead constrained to the adjacent first group actuation structures 80A, which do not deform since they are not biased and are in turn constrained to the frame 53 through the first connection portions 60 and the respective stiffening structures 85.

The first group actuation structures 80A of the second deformable ring 55B, being not biased and being constrained to the second group actuation structures 80B of the first deformable ring 55A (through the second connection portions 65 and respective stiffening structures 85) also move downwards (towards the inside of the cavity 52). Furthermore, the deformation of the second group actuation structures 80B of the second deformable ring 55B causes a further downward displacement of the respective end portions and thus of the third deformable ring 55C, towards the inside of the cavity 52.

Similarly, the deformation of the second group actuation structures 80B of the third deformable ring 55C causes the movable central portion 56 to further lower towards the inside of the cavity 52.

In practice, the deformable structure 54 allows a high translation of the movable central portion 56 with respect to the rest position, greater than the deformation of each deformable ring 55 caused by the respective actuation structures 80, both towards the inside of the cavity 52 and moving away from the cavity 52. The high displacement may be obtained applying low bias voltages.

The maximum deformation of the deformable structure 54 depends on multiple factors including number of deformable rings 55, thickness and diameter of the deformable structure 54 and of the movable central portion 56, thickness of the stiffening structures 85 and of the shutter structure 86 and maximum applicable voltage; such factors are parameters which may be modified during the design step according to a specific application.

For example, in simulations performed by the Applicant, it has been verified that the movable central portion may translate up to 80 µm (40 µm in each of the two directions) with a bias voltage of 40 V.

The deformation of the deformable structure 54 is such that it allows a vertical displacement of the movable central portion 56, while keeping the shutter structure 86 substantially parallel with respect to the rest position, a feature usable in specific applications.

Furthermore, again with reference to FIG. 2A, in use, the deformation of the deformable structure 54 generates a mechanical stress in the deformable rings 55. The mechanical stress generates, in the piezoelectric detection region 93, a detection voltage between the lower detection electrode 92 and the upper detection electrode 94 of each deformation sensor 91 (FIG. 2B). The detection voltage may be measured and converted, by the measuring circuit (shown for example in FIG. 7), into a deformation value of the deformable structure 54 and thus into a displacement value of the movable central portion 56 with respect to the rest position, in a known manner.

The measurement of the detection voltage thus allows, through a closed loop control system and in real time, the state of the piezoelectric actuator 50 to be controlled.

Furthermore, the dimensions of the piezoelectric actuator 50 are significantly reduced, since both the actuation structures 80 and the deformation sensors 91 are integrated in a same die.

Furthermore, since the deformation sensors 91 are of piezoelectric type, the measurement of the detection voltage is a passive detection, i.e., it does not imply a passage of current, thus making the piezoelectric actuator 50 energy efficient.

Figure 7:
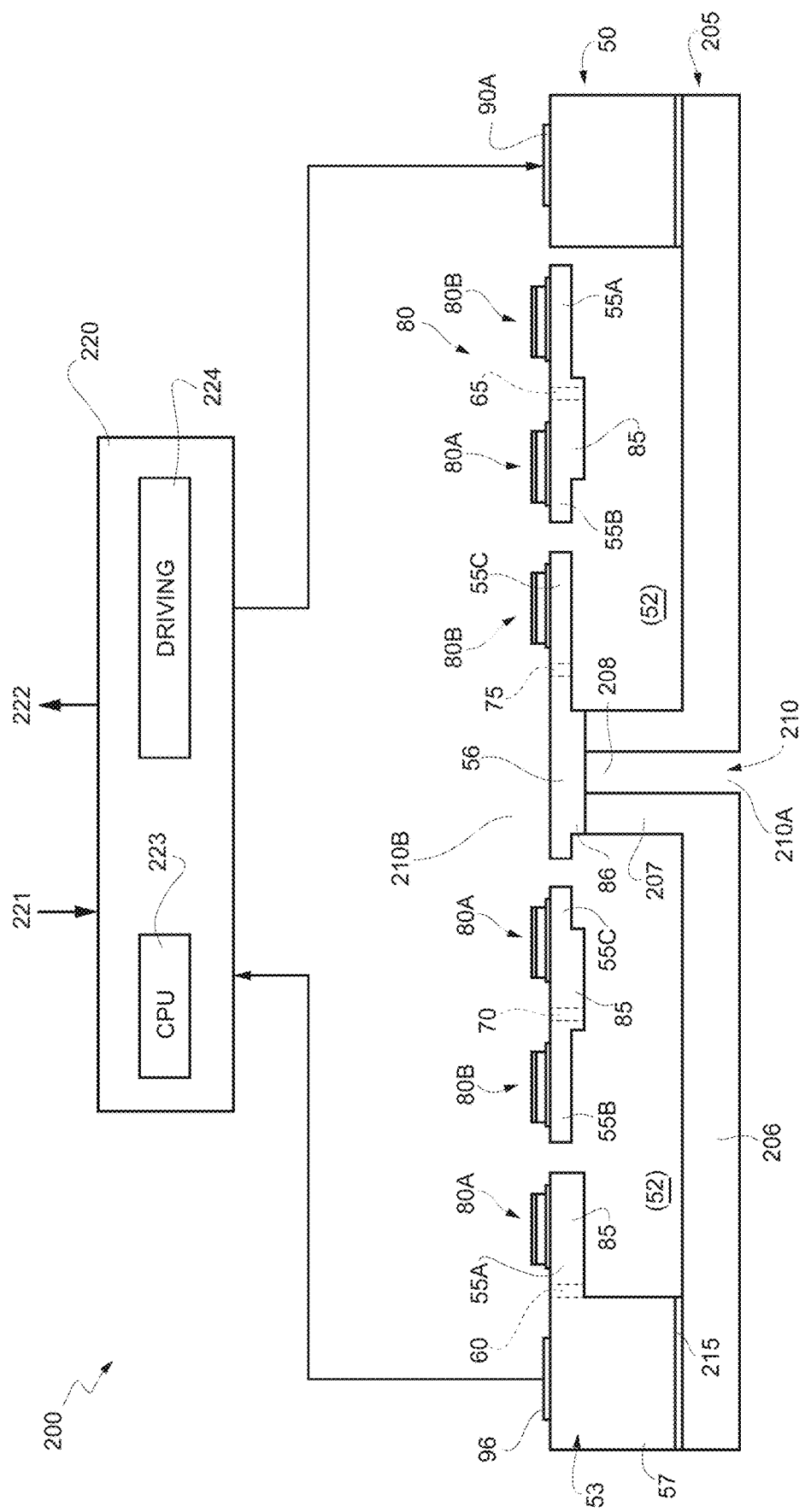
FIG. 7 is a schematic cross-section of a flow regulator incorporating the piezoelectric actuator of FIG. 2A, at rest.

The piezoelectric actuator 50 may be integrated in a flow regulator 200, as shown in FIG. 7. The flow regulator 200 comprises, in addition to the piezoelectric actuator 50, a body 205 and a fluidic channel 210, having an inlet portion 210A and an outlet portion 210B.

The body 205 is of semiconductor material, for example silicon, and is formed by a horizontal portion 206, a tubular protrusion 207 extending from the horizontal portion 206, transversely thereto, and a through opening 208, having a mouth which forms the inlet portion 210A of the fluidic channel 210 and passing through the tubular protrusion 207.

The horizontal portion 206 of the body 205 is bonded to the substrate 57 of the piezoelectric actuator 50 through a bonding region 215, so that the horizontal portion 206 of the body 205 faces the cavity 52 and the tubular protrusion 207 is aligned with the shutter structure 86. In particular, in this embodiment, the height of the tubular protrusion 207 is such that, at rest, the shutter structure 86 is in contact with one end of the tubular protrusion 207.

In addition, the flow regulator 200 comprises a control unit 220 coupled to the piezoelectric actuator 50, in particular to the actuation structures 80 and to the deformation sensors 91, through the contact pads 88, 90A, 90B and 96 of FIG. 2A (as shown schematically in FIG. 7), for the exchange of the signals and of the electrical quantities used to control the flow regulator 200.

To this end, the control unit 220 comprises input/output ports 221, 222 for receiving control signals and sending detection signals to the outside (for example towards a user), a control stage 223 (for example a CPU) for processing the signals provided for the control, and a driving stage 224, for controlling the flow regulator 200. The control stage 223 may for example store conversion tables between nominal flow values and the corresponding bias voltage value to be supplied to the piezoelectric actuator 50.

Figure 8:
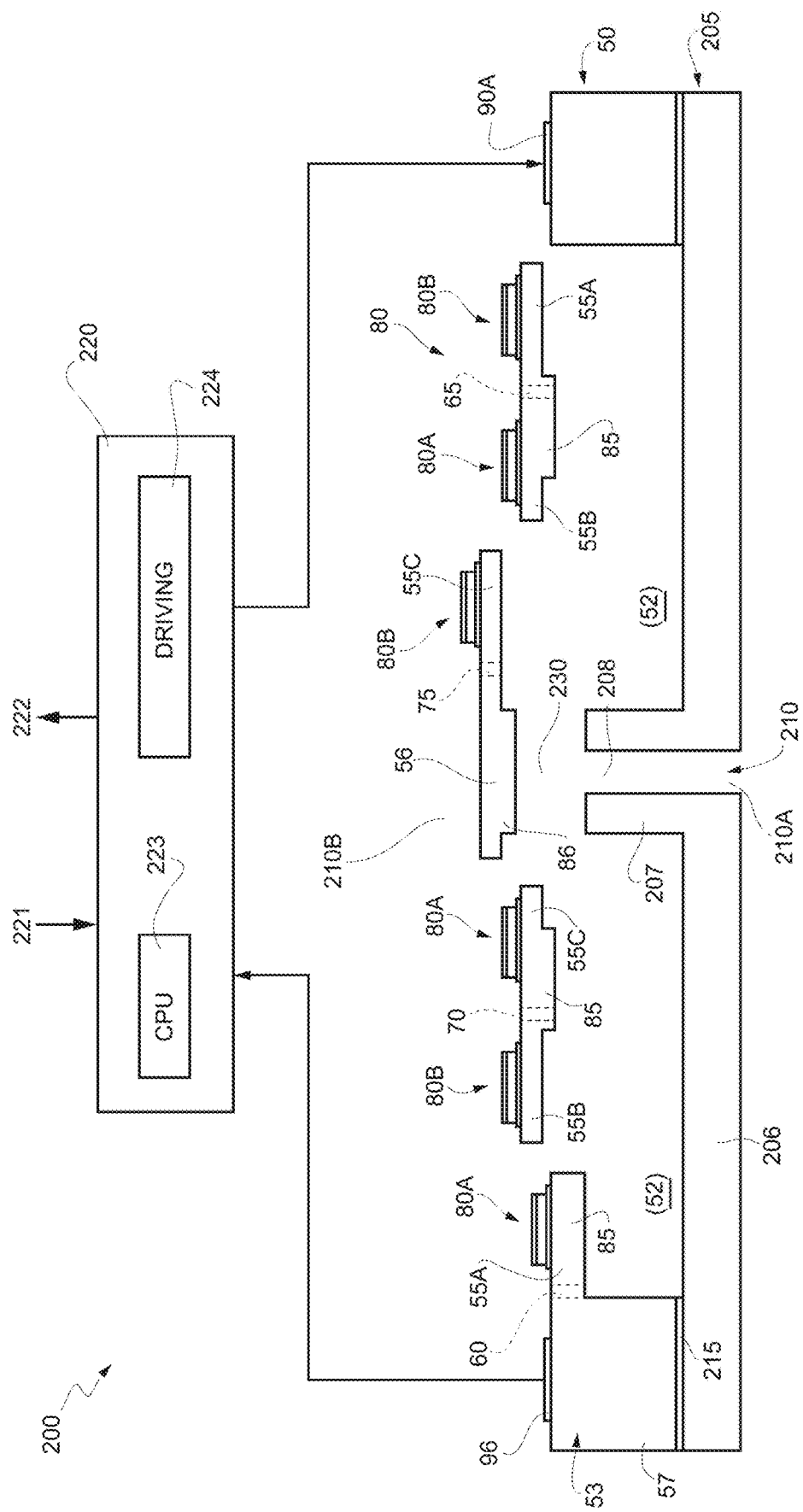
FIG. 8 shows the flow regulator of FIG. 7, in a different operating condition.

In use, a user may set, through the input ports 221, the nominal flow value of a fluid inside the fluidic channel 210. Based on the stored tables, the control unit 220 applies a bias voltage of suitable value to the first group actuation structures 80A. As previously explained and as shown in FIG. 8, the deformable structure 54 deforms and the movable central portion 56 (which thus forms here a cap element) moves the shutter structure 86 away from the end of the tubular protrusion 207, thus creating a passage 230 of the fluidic channel 210 and reciprocally spacing the deformable rings 55 and the movable central portion 56 which thus form the outlet portion 210B of the fluidic channel 210. Thus, in the deformed position of FIG. 8, the passage 230 connects the inlet portion 210A to the outlet portion 210B through the through opening 208 and thus allows the flow of a liquid or gas (e.g., a fluid) supplied to the inlet portion 210A.

Simultaneously, and as previously explained, the deformation sensors 91 (not shown here) detect the stress generated by the deformation of the deformable structure 54 and provide the control unit 220 with a corresponding detection voltage.

The control unit 220 may then compare the value of the detection voltage, or quantities related thereto, with suitable calibration parameters corresponding to a flow value and verify, in real time, that the fluid flow complies with the nominal value. If not, the control unit 220 may modify the bias voltage so as to make the flow comply with the nominal value.

Figure 9:
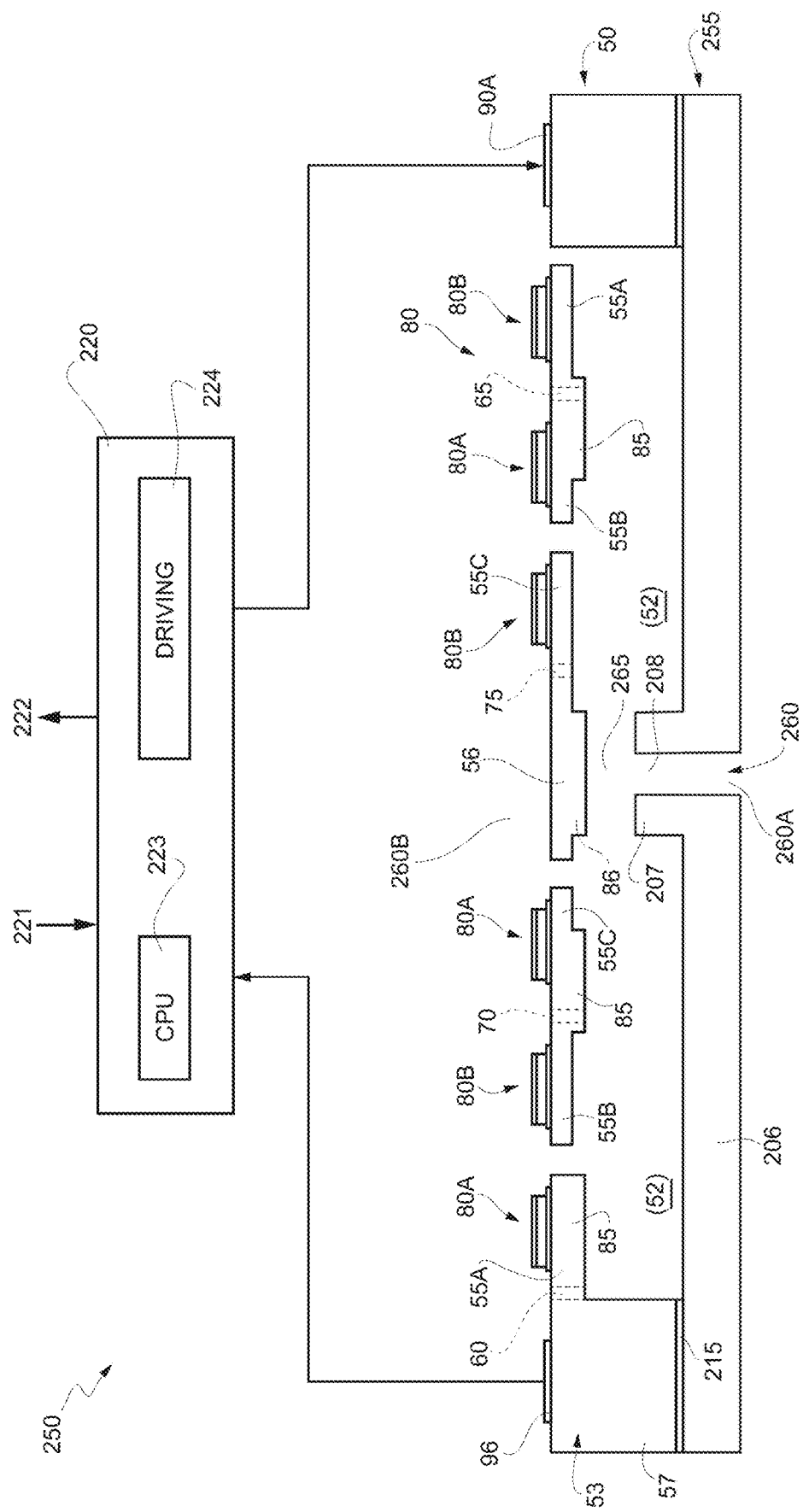
FIG. 9 is a schematic cross-section of a different flow regulator incorporating the piezoelectric actuator of FIG. 2A, at rest.
Figure 10:
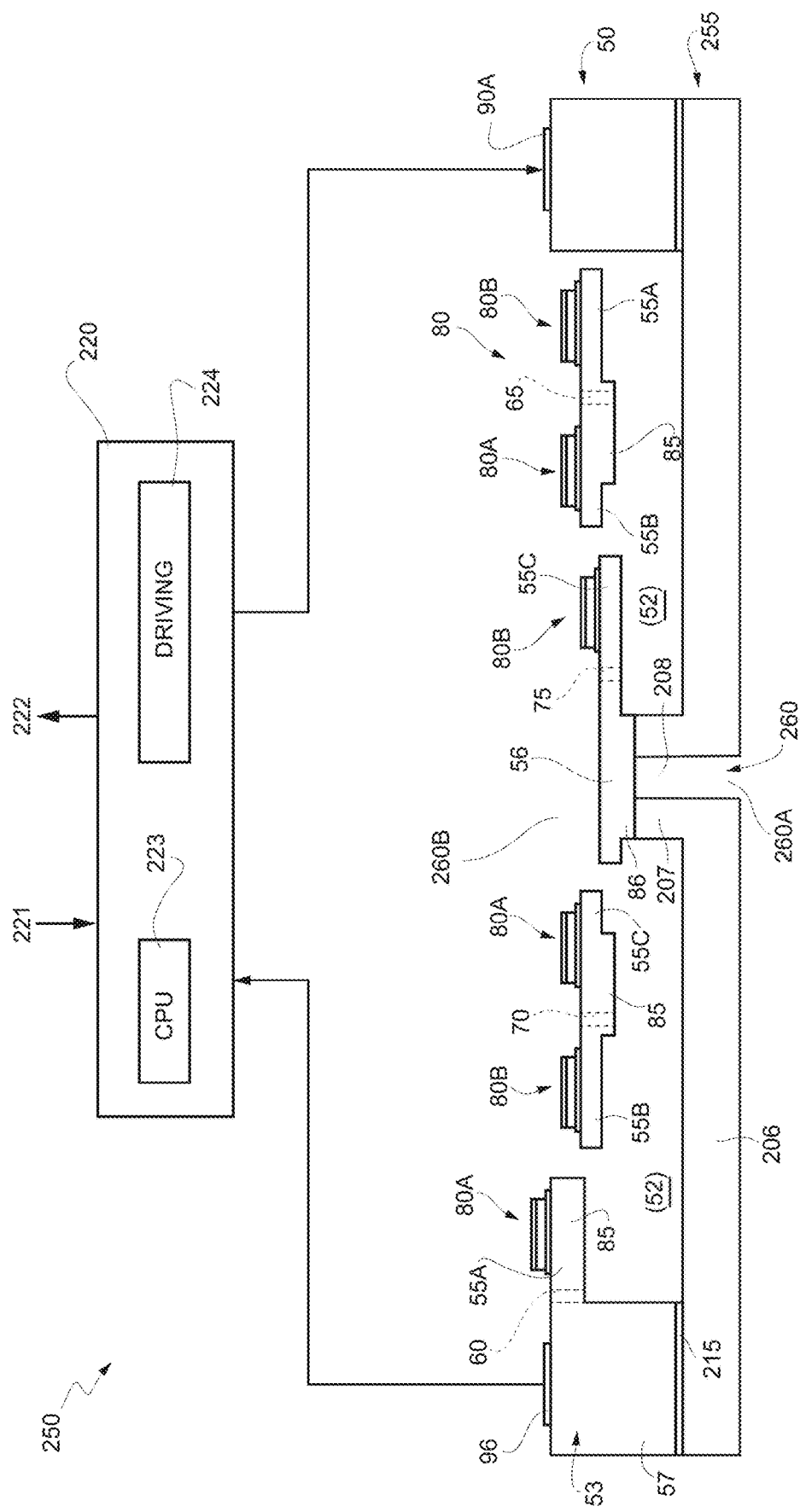
FIG. 10 shows the flow regulator of FIG. 9, in a different operating condition.

FIGS. 9 and 10 show another embodiment of a flow regulator, indicated here with 250, similar to the flow regulator 200, therefore common elements will be identified with the same numbers.

In detail, the flow regulator 250 comprises the piezoelectric actuator 50, a body 255 and a fluidic channel 260, having an inlet portion 260A and an outlet portion 260B. Unlike the flow regulator 200 of FIG. 7, the height of the tubular protrusion 207 is such that, at rest, its end extends at a distance from the shutter structure 86 and the fluidic channel 260 of the flow regulator 250 forms, at rest, a passage 265 delimited by the shutter structure 86 and the tubular protrusion 207.

In this manner, in the absence of a bias voltage, the fluid may flow between the inlet portion 260A and the outlet portion 260B of the fluidic channel 260.

In use, when modifying or blocking the flow through the fluidic channel 260, a bias voltage is applied to the actuation structures 80 to set a nominal flow value. In this embodiment, the bias voltage is applied to the second group actuation structures 80B, causing a downward displacement of the deformable structure 54, and causing the shutter structure 86 to move closer to the tubular protrusion 207, as shown in FIG. 10. In this manner, the section of the passage 265 decreases, and thus the flow decreases; the flow may also be completely interrupted in the case of complete closure of the passage 265.

Figure 11:
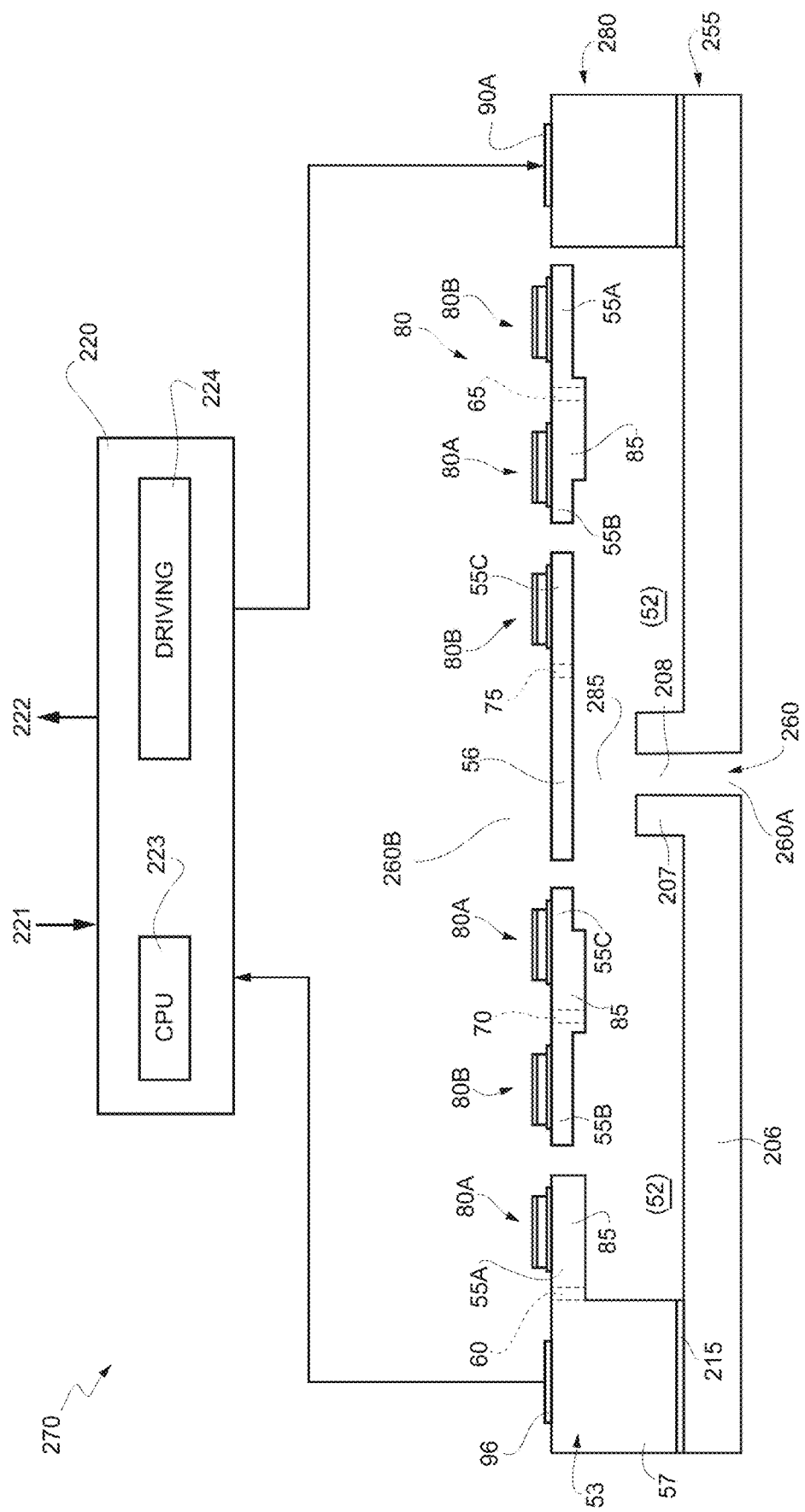
FIG. 11 is a schematic cross-section of a flow regulator incorporating a further embodiment of the present piezoelectric actuator, at rest.

FIG. 11 shows a flow regulator 270 incorporating the present piezoelectric actuator according to a further embodiment, hereinafter referred to as piezoelectric actuator 280. The flow regulator 270 and the piezoelectric actuator 280 have a structure similar to the flow regulator 250 and the piezoelectric actuator 50, respectively, thus elements in common are identified by the same reference numbers.

In particular, here, the movable central portion 56 faces directly the tubular protrusion 207 and is, at rest, at a distance from the tubular protrusion 207, forming a passage 285. In use, the bias voltage may move the movable central portion 56 closer to or away from the tubular protrusion 207, modifying the section of the passage 285, as previously explained. In practice, here, the passage 285 is delimited by the tubular protrusion 207 and by the movable central portion 56 and the shutter structure 86 is not present.

According to another embodiment, the piezoelectric actuator 50, 280 may be integrated into a speaker.

In particular, in FIG. 12, a speaker 300 comprises the piezoelectric actuator 50. However, it is apparent to the skilled in the art that the piezoelectric actuator 280 may also be integrated in a similar manner into the speaker 300.

The speaker 300 comprises a shell 303 delimiting a cavity 305; a support 307, attached to the shell 303; and a diaphragm 306, carried by the support 307 and suspended on the cavity 305.

The shell 303 is approximately a hemispherical or dome-shaped shell; the support 307 and the diaphragm 306 close the shell at the back.

The speaker 300 further comprises the actuator 50 and a control unit 320, arranged inside the cavity 305. Alternatively, the control unit 320 may be made outside the shell 303.

The control unit 320 is coupled to the piezoelectric actuator 50, in particular to the actuation structures 80, as already described for example with reference to FIG. 7.

The movable central portion 56 and the shutter structure 86 of the piezoelectric actuator 50 are mechanically coupled to the diaphragm 306, for example they are bonded thereto.

In use, the control unit 320 applies a bias voltage, of suitable frequency, to the first and/or second group actuation structures 80A, 80B, causing a displacement of the movable central portion 56 (as previously described) and thus a deformation of the diaphragm 306, which thus oscillates back and forth (i.e., towards the inside and the outside of the cavity 305) with respect to a plane perpendicular to the plane of the drawing. Thus, the deformation of the diaphragm 306 generates an acoustic wave which may propagate outside the speaker 300.

Thus, the speaker 300 may have reduced dimensions and high energy efficiency, due to the characteristics of the piezoelectric actuator 50 previously described.

Fabrication steps which lead to the manufacturing of the piezoelectric MEMS actuator 50 shown in FIG. 2A are described herein below.

In particular, FIGS. 13A-21A show the fabrication method of the piezoelectric MEMS actuator 50 at an actuation structure 80, a deformation sensor 91 and, partially, the deformable structure 54 in a circumferential cross section taken along a deformable ring 55; FIGS. 13B-21B show the fabrication method of the piezoelectric MEMS actuator 50 at the actuation structures 80 and, partially, the deformable structure 54 and the frame 53 in a radial cross section taken through different adjacent deformable rings 55.

FIGS. 13A and 13B show a wafer 400 which has already undergone first processing steps. In detail, the wafer 400 comprises a work substrate 405 of semiconductor material, for example silicon, having a first and a second surface 405A, 405B, arranged, respectively, on a front side and a back side of the wafer 400. A first shaping layer 406, for example of deposited tetraethyl orthosilicate (TEOS), having for example a thickness of at least 1 μm, here of 1 μm, extends on the first surface 405A of the work substrate 405.

Figure 14A:
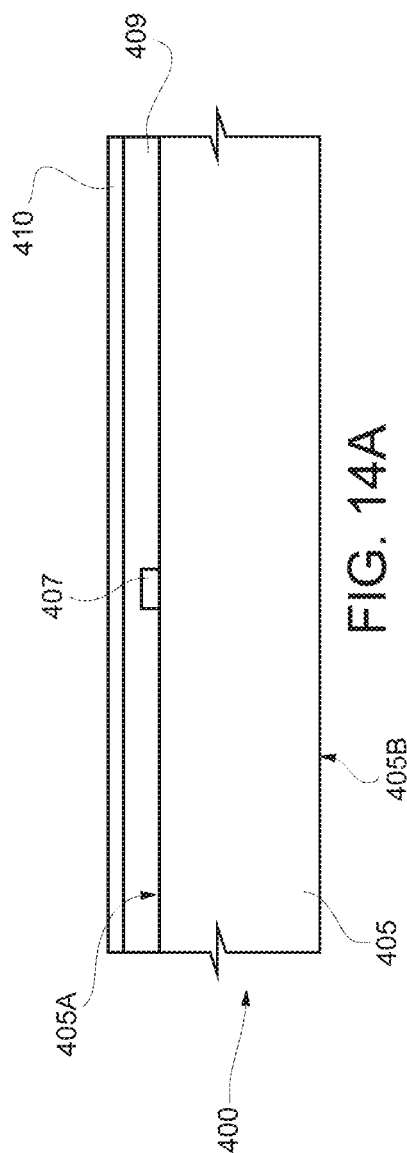
Figure 14B:
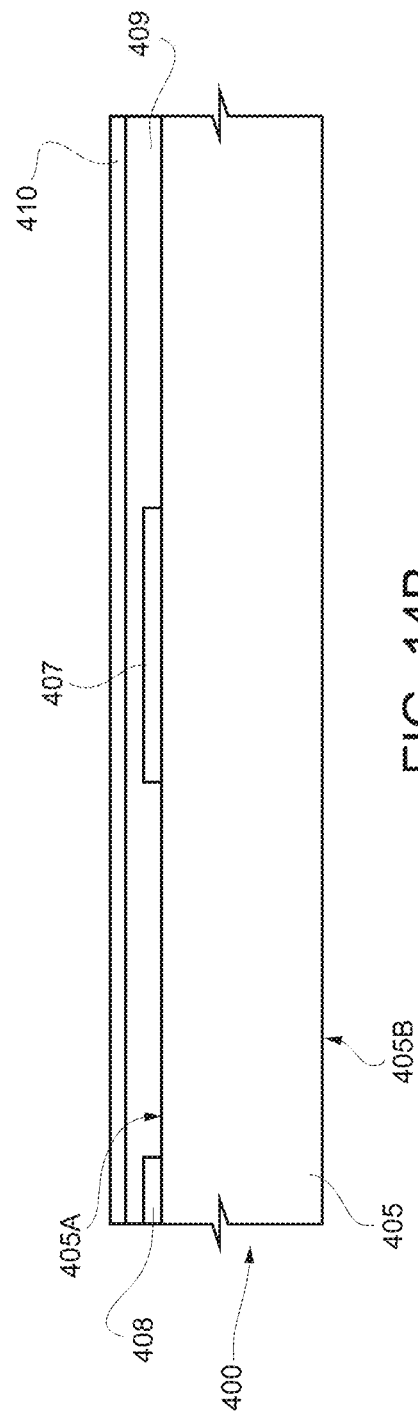

Subsequently, FIGS. 14A and 14B, the first shaping layer 406 is patterned through selective etching so as to form a plurality of first lower shaping regions 407 and a second lower shaping region 408, where it is desired to subsequently form, respectively, the plurality of stiffening structures 85 and the shutter structure 86, as described hereinafter in detail.

Furthermore, a stiffening layer 409 of semiconductor material, for example polysilicon, is formed, for example epitaxially grown, on the first surface 405A of the work substrate 405, on the plurality of first lower shaping regions 407 and on the second lower shaping region 408; the stiffening layer 409 is then subject to chemical-mechanical polishing (CMP), so as to form a flat upper surface. The stiffening layer 409 has a greater thickness than the first shaping layer 406, in this embodiment of, for example, 25 µm.

Subsequently, a first insulating layer 410, for example of tetraethyl orthosilicate (TEOS) and having here a thickness comparable with that of the first shaping layer 406, for example here of 1 µm, is deposited on the stiffening layer 409.

Figure 15A:
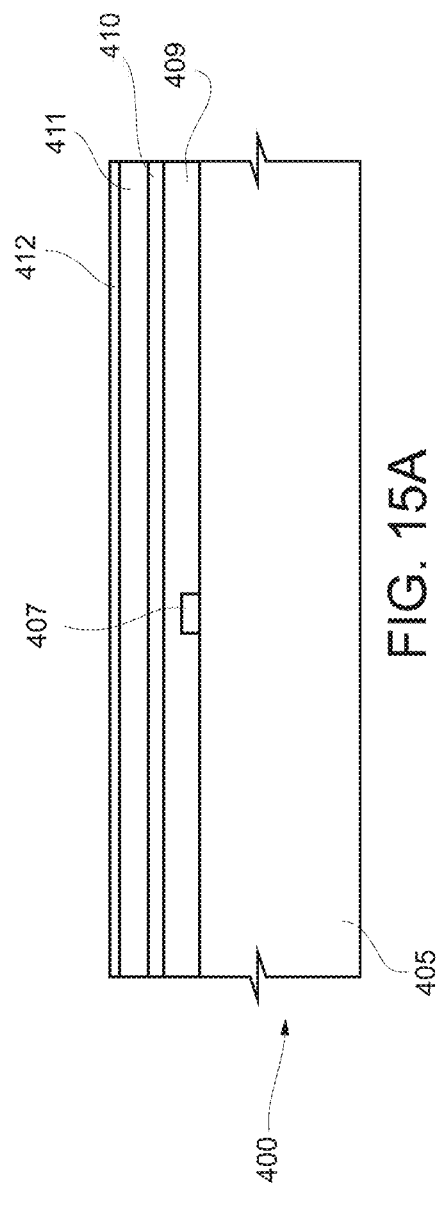
Figure 15B:
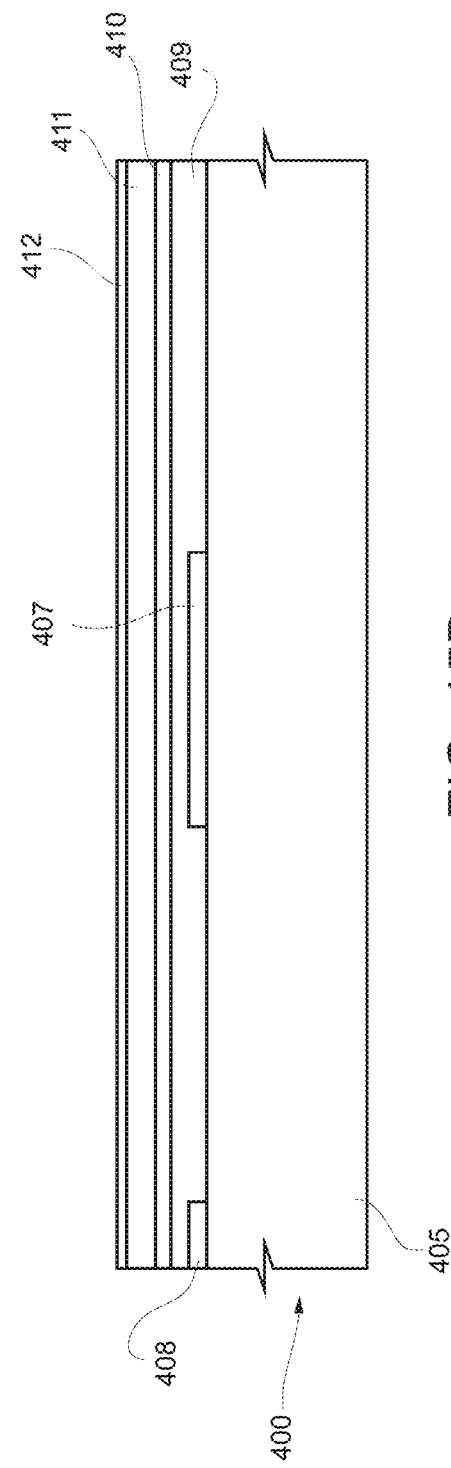

In FIGS. 15A and 15B, a structural layer 411, of semiconductor material such as polysilicon, is deposited on the first insulating layer 410. The structural layer 411 has a thickness chosen based on desired mechanical characteristics, for example, in this embodiment, it has a thickness of 10 µm.

A second insulating layer 412, for example of tetraethyl orthosilicate (TEOS) and having here a thickness of, for example, 0.5 µm, is deposited on the structural layer 411.

Subsequently, FIGS. 16A and 16B, a first conductive layer 420, for example of platinum, is deposited on the second insulating layer 412; an actuation layer 421 of unimorph piezoelectric material having high relative dielectric permittivity, for example greater than 100, such as lead zirconate titanate (PZT), $BaTiO_3$, KNN (sodium potassium niobate), $PbTiO_2$ or $PbNb_2O_6$, is deposited on the first conductive layer 420 for a thickness in the range 1-3 µm, in particular for example of 2 µm; a second conductive layer 422, for example of a tungsten-titanium alloy, of platinum, yttrium or iridium oxide, is deposited on the actuation layer 421, forming a stack of layers.

The stack of layers thus obtained is patterned by lithographic and selective etching steps, known to the person skilled in the art, so that the first conductive layer 420 forms a lower electrode region 415, the actuation layer 421 forms a plurality of first piezoelectric regions 416 and the second conductive layer 422 forms a plurality of upper electrode regions 417.

In particular, the plurality of upper electrode regions 417 and the plurality of first piezoelectric regions 416 are patterned in a first etching step and thus have the same shape; the lower electrode region 415 is patterned in a separate etching step, for example after patterning the plurality of upper electrode regions 417 and first piezoelectric regions 416, and comprises a plurality of actuation portions 415A, a plurality of detection portions 415B (a single detection portion is visible in FIG. 16A) and a plurality of electrical connection portions 415C. In detail, each of the plurality of actuation portions 415A is approximately underlying respective upper electrode regions 417 and first piezoelectric regions 416; each detection portion 415B extends laterally, on one side only, in particular to the right in FIG. 16A, with respect to the plurality of upper electrode regions 417 and of first piezoelectric regions 416; and each electrical connection portion 415C extends laterally, in particular on both sides in FIG. 16A, with respect to the plurality of upper electrode regions 417 and of first piezoelectric regions 416.

Each actuation portion 415A of the lower electrode region 415, each first piezoelectric region 416 and each upper electrode region 417 form, respectively, the lower actuation electrode 81, the piezoelectric actuation region 82 and the upper actuation electrode 83 of each actuation structure 80.

Figure 16A:
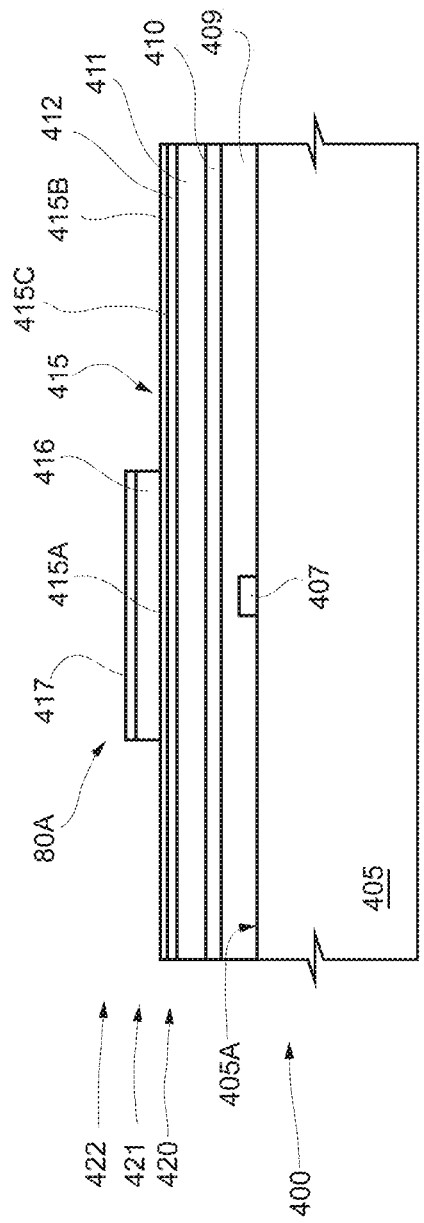
Figure 16B:
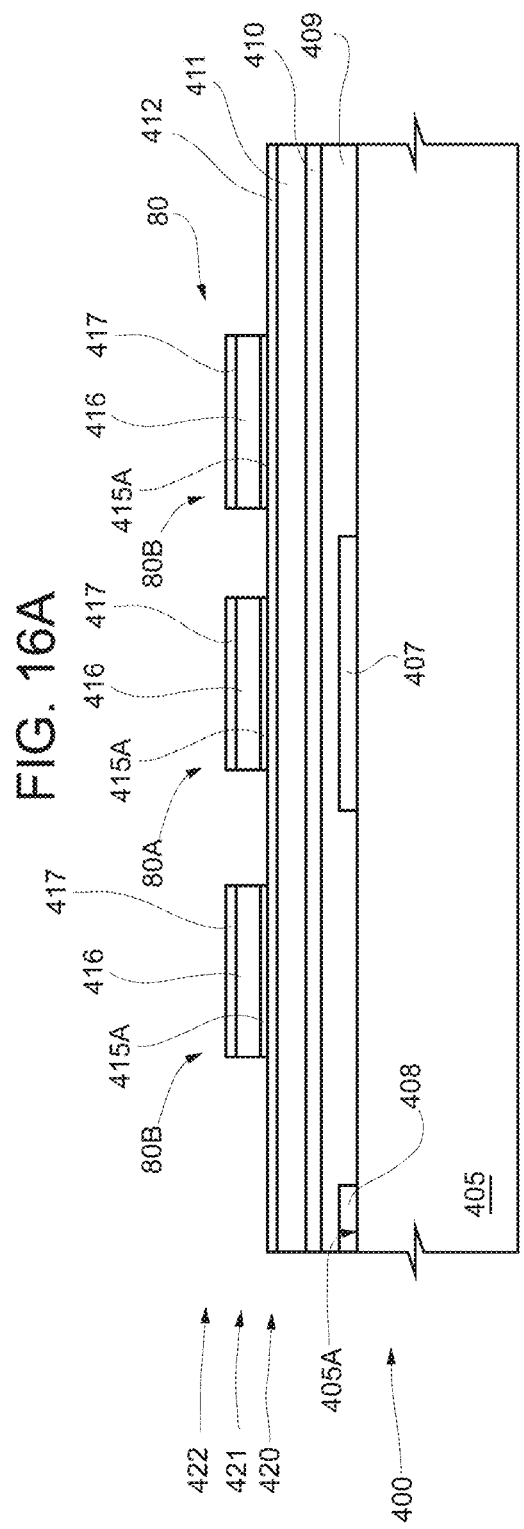

In particular, FIGS. 16A and 16B show a first group actuation structure 80A (at a respective first lower shaping region 407) and FIG. 16B shows two second group actuation structures 80B which are adjacent, in the radial direction of the actuator 50 of FIG. 4A, to the first group actuation structure 80A.

Figure 17A:
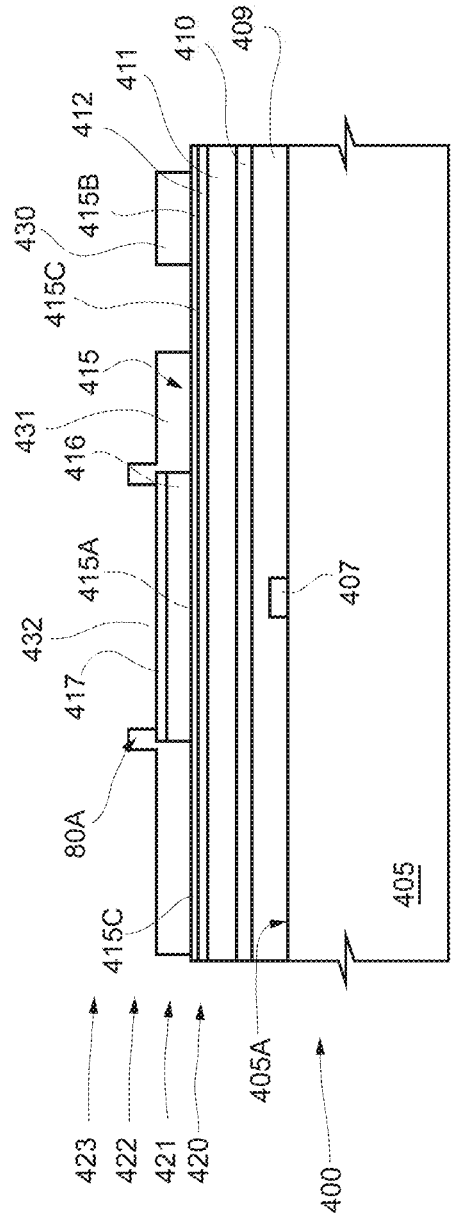
Figure 17B:
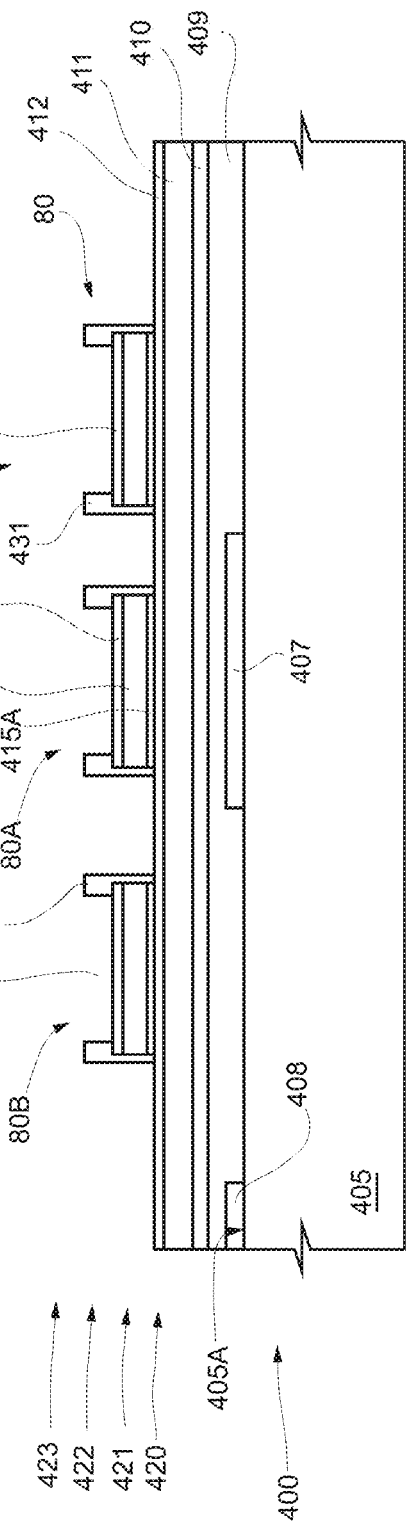

Subsequently, FIGS. 17A and 17B, a piezoelectric layer 423, for example of aluminum nitride (AlN) and having a thickness in the range 0.5-3 µm, in particular of 1 µm, is deposited on the front side of the wafer 400 and patterned, through lithography and selective etching, so as to form a plurality of second piezoelectric regions 430 (only one visible in FIG. 17A) and a plurality of passivation regions 431.

The passivation regions 431 each surround a respective actuation structure 80, extend on part of the electrical connection portion 415C of the lower electrode region 415 (FIG. 17A) and on part of the second insulating layer 412 (FIG. 17B) and form a plurality of first openings 432 each overlying a respective upper electrode region 417.

The second piezoelectric regions 430 each extend over respective detection portions 415B of the lower electrode region 415, at a distance from a respective passivation region 431.

Subsequently, FIGS. 18A and 18B, a third conductive layer 424, for example of molybdenum, platinum, yttrium or iridium oxide, is deposited above the wafer 400 (on the front side of the wafer 400) and patterned, so as to form a first, a second and a third conductive connection region 435-437 and an upper detection electrode region 438, as explained hereinbelow.

In detail, the first and the second conductive connection regions 435, 436 extend over the first and the second group actuation structures 80A, 80B, respectively, inside the plurality of first openings 432, in contact with a respective upper electrode region 417, and above a respective passivation region 431.

Furthermore, in this embodiment, portions of the first and the second conductive connection regions 435, 436 extend to the side of each actuation structure 80 (FIG. 18B), on the second insulating layer 412, forming the first and the second conductive tracks 89A, 89B, respectively, of the piezoelectric actuator 50 (FIG. 2A). In particular, the first conductive connection region 435 connects the first group actuation structures 80A to each other and to the first group upper electrode pad 90A, and the second conductive connection region 436 connects the second group actuation structures 80B to each other and to the second group upper electrode pad 90B of the piezoelectric actuator 50.

The upper detection electrode region 438 extends over each second piezoelectric region 430 and is in direct electrical contact with the third conductive connection region 437, corresponding to the third conductive track 95 of FIG. 2A and extending over the second insulating layer 412, for the electrical connection to the respective detection pads 96 shown in FIG. 2A.

In practice, each detection portion 415B of the lower electrode region 415, each second piezoelectric region 430 and each upper detection electrode region 438 form, respectively, the lower detection electrode 92, the piezoelectric detection region 93 and the upper detection electrode 94 of each deformation sensor 91 (here, as indicated hereinabove, one per deformable ring 55).

Subsequently, FIGS. 19A and 19B, the wafer 400 is subject to selective etchings, on the front side, so as to create trenches 445 extending through the second insulating layer 412 and the structural layer 411. In particular, in FIG. 19B, two trenches 445 are visible, extending to the left of the first group actuation structure 80A, between the first and the second group actuation structures 80A, 80B and to the right of the second group actuation structure 80B.

In detail, the trenches 445 are usable for separating the deformable rings 55 from each other and from the movable central portion 56 (FIG. 2A), as explained hereinafter.

Furthermore, again with reference to FIGS. 19A and 19B, a second shaping layer 450 is deposited on the second surface 405B of the work substrate 405 and patterned lithographically so as to form a window 451 on the back side of the wafer 400, below the actuation structures 80, the deformation sensors 91 and the second lower shaping region 408.

Figure 20A:
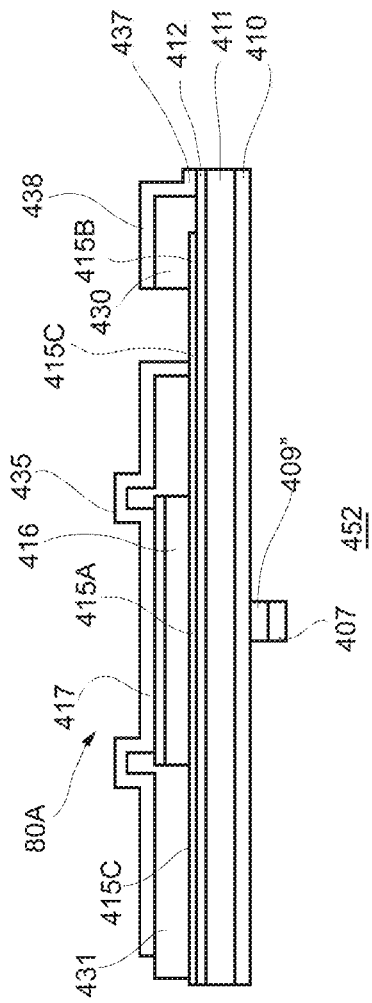
Figure 20B:
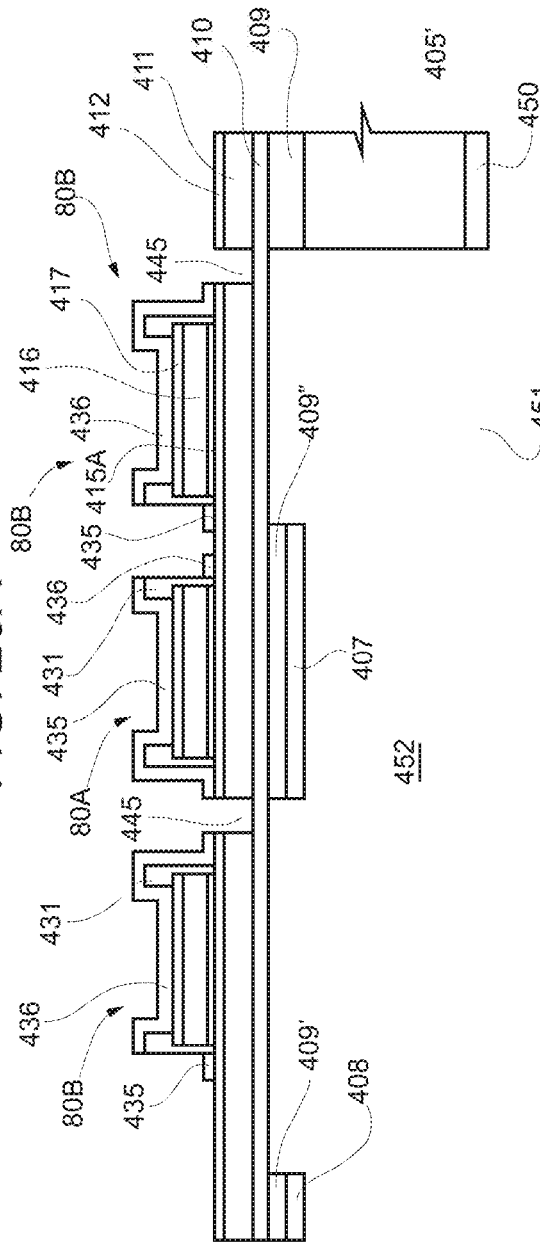

Subsequently, FIGS. 20A and 20B, the wafer 400 is selectively etched, for example by means of dry chemical etching, starting from the second surface 405B of the work substrate 405, removing the semiconductor material thereof at the window 451. Furthermore, portions of the stiffening layer 409, which are not covered by the first lower shaping region 407 and by the plurality of second lower shaping regions 408, are removed. A work cavity 452, corresponding to the cavity 52 of the piezoelectric actuator 50, is thus formed. Thus, a bearing portion 405', corresponding to the substrate 57 of the piezoelectric actuator 50 remains from the work substrate 405, and a central portion 409' and a plurality of connection portions 409" remain from the stiffening layer 409.

Using the second shaping layer 450 again as an etching mask, the first lower shaping region 407, the plurality of second lower shaping regions 408 and portions of the first insulating layer 410, on the sides of the central portion 409' and of the plurality of connection portions 409" of the stiffening layer 409, are then removed. In this manner, the trenches 445 become through-trenches, FIG. 21B.

The second shaping layer 450 is then removed.

As shown in FIGS. 21A and 21B, the central portion 409' of the stiffening layer 409 and the remaining portion (indicated with 410') of the first insulating layer 410 form the shutter structure 86; the plurality of connection portions 409" of the stiffening layer 409 and the remaining portions (indicated with 410") of the first insulating layer 410 form the stiffening structures 85. Furthermore, the structural layer 411 and the second insulating layer 412, on the sides of the work cavity 452, form, together with the bearing portion 405' of the substrate 405, the frame 53 and, above the work cavity 452, form the connection portions 60, 65, 70, 75, the movable central portion 56 and the deformable rings 55A-55C, identified with a dashed line in FIG. 21B.

Finally, the wafer 400 is diced and each die, after usual electrical connection and packaging steps, forms the piezoelectric actuator 50 shown in FIG. 2A.

In the described process, the passivation region 431 is made, for example, of aluminum nitride. In fact, aluminum nitride has excellent electrical insulation properties and is chemically stable up to high temperatures (even up to 1077° C.) also in an oxidizing environment such as air and humidity. Consequently, the passivation region 431 allows the piezoelectric actuator 50 to be passivated by depositing and patterning a single layer of material, thus reducing the fabrication steps and costs of the piezoelectric actuator 50 itself.

Finally, it is clear that modifications and variations may be made to the piezoelectric actuator 50, 280 and the fabrication method described and illustrated herein without thereby departing from the protective scope of the present disclosure, as defined in the attached claims.

For example, the fabrication method described herein may be adapted, in a manner apparent to the person skilled in the art, for the fabrication of the piezoelectric actuator 280, for example by forming, starting from the first shaping layer 406, only the lower shaping region usable to obtain the stiffening structures 85.

Obviously, the number of deformable rings, actuation structures and deformation sensors may be modified based on the specific application.

Furthermore, the deformation sensors may be arranged on one or more deformable rings.

The layers forming the deformable structure 54 may have different thicknesses, depending on the deformation and the application desired.

Furthermore, the fluidic channel may have a different shape.

For example, the biasing and measuring electric circuits may be formed in the same die as the piezoelectric actuator.

The control unit 220, 320 may be integrated in the piezoelectric actuator 50, 280 or in the body 205, or be formed by a standalone device, for example an ASIC.

Furthermore, the lower actuation electrode and the lower detection electrode may be formed by distinct conductive regions.

At least one embodiment of the present disclosure is directed to a MEMS actuator (50; 280) comprising: a body (51) surrounding a cavity (52); a deformable structure (54) suspended on the cavity and comprising a movable portion (56) and a plurality of deformable elements (55), arranged consecutively to each other, connecting the movable portion to the body and each subject to a deformation; and at least one plurality of actuation structures (80A, 80B) supported by the deformable elements (55) and configured to cause a translation of the movable portion greater than the deformation of each deformable element (55), the actuation structures each comprising a respective first piezoelectric region (82).

In some embodiments, the deformable structure (54) is monolithic, substantially planar, and comprises a semiconductor material layer (411), and wherein the movable portion (56) and the deformable elements (55) are adjacent structures, having, at rest, upper surfaces lying in a plane.

In some embodiments, the deformable elements (55) have a generally annular shape and surround the movable portion (56); the at least one plurality of actuation structures is a first plurality of actuation structures (80A), the first plurality of actuation structures being configured to deform the deformable structure (54) and move the movable portion (56) along a first direction; the actuator further comprises a second plurality of actuation structures (80B), the actuation structures of the second plurality of actuation structures each comprising a respective piezoelectric region equal to the first piezoelectric region (83), the second plurality of actuation structures being configured to deform the deformable structure (54) and move the movable portion (56) along a second direction.

In some embodiments, the actuation structures of the first and the second pluralities of actuation structures (80A, 80B) are arranged alternately in succession in each deformable element (55) and wherein the deformable structure (54) comprises a plurality of arms (60, 65, 70, 75); first arms (60) of the plurality of arms extending between the body (51) and the plurality of deformable elements; second arms (65, 70) of the plurality of arms extending between adjacent deformable elements of the plurality of deformable elements; and third arms (75) of the plurality of arms extending between the plurality of deformable elements and the movable portion (56), wherein the second arms (65, 70) couple the actuation structures of the first plurality of actuation structures on the deformable elements to actuation structures of the second plurality of actuation structures on the adjacent deformable elements.

In some embodiments, the deformable structure further comprises a plurality of stiffening structures (85), the stiffening structures being supported by the deformable elements (55) on an opposite side with respect to the actuation structures of the first plurality of actuation structures (80A), each stiffening structure being arranged at a central portion of a respective actuation structure of the first plurality of actuation structures (80A) and being integral with a respective arm of the plurality of arms.

In some embodiments, the plurality of deformable elements (55) comprise a plurality of concentric rings, the actuation structures of the first and the second pluralities of actuation structures (80A, 80B) are formed by piezoelectric strips extending annularly and at a uniform mutual distance on each deformable element, each piezoelectric strip defining a curved median line having a center (C), wherein each arm (60, 65, 70, 75) is radially aligned with the center of an actuation structure of the second plurality of actuation structures (80B) placed on a first deformable element of the plurality of deformable elements (55) and with the center of an actuation structure of the first plurality of actuation structures (80A) placed on a second deformable element of the plurality of deformable elements, the second deformable element being adjacent and internal to the first deformable element.

In some embodiments, the movable portion (56) is formed by a platform and the deformable structure (54) comprises a shutter structure (86) formed by a region protruding from the movable portion (56).

In some embodiments, at least one detection structure (91) supported by the deformable structure (54) and configured to detect the deformation of the deformable structure, each detection structure comprising a respective second piezoelectric region (93).

In some embodiments, the actuation structures of the at least one plurality of actuation structures (80A, 80B) each comprise a respective first stack of regions including a lower actuation electrode (81), the first piezoelectric region (82) and an upper actuation electrode (83) and the at least one detection structure (91) comprises a respective second stack of regions including a lower detection electrode (92), the second piezoelectric region (93) and an upper detection electrode (94), wherein the lower detection electrode (92) of each detection structure (91) and the lower actuation electrode (81) of each actuation structure are formed by a single conductive region.

In some embodiments, a plurality of passivation regions (431), each passivation region surrounding a respective actuation structure of the at least one plurality of actuation structures (80A, 80B) and being formed by the same material as the second piezoelectric region (93).

At least one embodiment of the present disclosure is directed to a flow regulator (200; 250; 270) comprising: a channel body (205; 255); a fluidic channel (210; 260) extending inside the channel body and having an end portion; the MEMS actuator according to any of claims 8-10, wherein the movable portion (56) faces the end portion and is configured to modify a passage section arranged between the end portion and the movable portion; a control unit (220), coupled to the MEMS actuator and configured to provide the at least one plurality of actuation structures (80A, 80B) with a bias voltage and to receive a detection voltage from the at least one detection structure (91).

In some embodiments, the end portion of the fluidic channel is in contact, at rest, with the movable portion (56).

In some embodiments, the end portion of the fluidic channel extends, at a distance, at rest, from the movable portion (56) and forms a fluidic passage (265; 285) therewith.

At least one embodiment of the present disclosure is directed to a speaker (300) comprising: a shell (303) delimiting a cavity (305); a diaphragm (306), attached to the shell and suspended on the cavity; the MEMS actuator of any of claims 8-10, wherein the deformable structure (54) is coupled to the diaphragm and is configured to cause a deformation thereof; a control unit (320), coupled to the MEMS actuator and configured to provide the at least one plurality of actuation structures (80A, 80B) with a bias voltage and to receive a detection voltage from the at least one detection structure (91).

At least one embodiment of the present disclosure is directed to a method for actuating an embodiment of a MEMS actuator of the present disclosure, comprising the steps of: providing, by a control unit, the first plurality of actuation structures (80A) with a first bias voltage and not providing the second plurality of actuation structures (80B) with any bias voltage, so as to cause a local deformation of portions of the deformable elements (55) supporting the actuation structures of the first plurality of actuation structures and the translation of the movable portion (56) along a first direction; providing, by the control unit, the second plurality of actuation structures (80B) with a second bias voltage and not providing the first plurality of actuation structures (80A) with any bias voltage, so as to cause a local deformation of portions of the deformable elements (55) supporting the actuation structures of the second plurality of actuation structures and the translation of the movable portion along a second direction, opposite to the first direction.

At least one embodiment of the present disclosure is directed to a method of fabricating an embodiment to a MEMS actuator of the present disclosure, comprising the steps of: forming a cavity (452, 52) in a work substrate (405) of a semiconductor material wafer (400), defining a deformable structure (54) suspended on the cavity and a frame portion (53) surrounding the suspended structure; defining the deformable structure (54) to form a movable portion (56) and a plurality of deformable elements (55), arranged consecutively to each other and connecting the movable portion to the frame portion and each subject to a deformation; and forming at least one plurality of actuation structures (80A, 80B) above the deformable elements (55), the actuation structures each comprising a respective first piezoelectric region (82).

In some embodiments of a method of fabricating an embodiment of a MEMS actuator of the present disclosure may include forming a cavity in a work substrate comprises the steps of: forming, on a first surface (405A) of the work substrate (405), a plurality of shaping regions (407, 408); forming, on the plurality of shaping regions, a stiffening layer (409) and a structural layer (411); forming a plurality of trenches (445) in the structural layer; and selectively removing the substrate from a second surface (405B), opposite to the first surface, up to the structural layer, forming the cavity, a plurality of stiffening structures (85), the deformable structure (54) and a shutter structure (86) protruding from the structural layer towards the cavity.

In some embodiments of a method of fabricating an embodiment of a MEMS actuator of the present disclosure may include the step of forming at least one detection structure (91) above the deformable elements, the at least one detection structure each comprising a respective second piezoelectric region (93).

In some embodiments of a method of fabricating an embodiment of a MEMS actuator of the present disclosure may include forming the at least one plurality of actuation structures includes: forming a plurality of lower actuation electrode regions (81) from a first conductive layer (420); forming a plurality of first piezoelectric regions (82), each first piezoelectric region on a respective lower actuation electrode region, from a first piezoelectric layer (421); and forming a plurality of upper actuation electrode regions (83), each upper actuation electrode region on a respective first piezoelectric region, from a second conductive layer (422); and forming the at least one detection structure includes: forming at least one lower detection electrode region (92) from the first conductive layer (420); forming the respective second piezoelectric region (93) on the at least one lower detection electrode region, from a second piezoelectric layer (423); forming at least one upper detection electrode region (94), each upper detection electrode region on a respective second piezoelectric region, from a third conductive layer (424).

In some embodiments of a method of fabricating an embodiment of a MEMS actuator of the present disclosure may include forming the respective second piezoelectric region comprises depositing the second piezoelectric layer (423) and patterning the second piezoelectric layer, forming the respective second piezoelectric region (93) and a plurality of passivation regions (431), each passivation region surrounding a respective actuation structure (80A, 80B) belonging to the at least one plurality of actuation structures.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS actuator, comprising:
a body surrounding a cavity;
a deformable structure on the cavity, the deformable structure including:
  a movable portion;
  a plurality of deformable elements arranged consecutively, the plurality of deformable elements connects the movable portion to the body;
  a plurality of arms coupling the movable portion, the plurality of deformable elements, and the body together; and
  a plurality of stiffening structures, respective ones of the plurality of stiffening structures being integral with respective ones of the plurality of arms;
at least one plurality of actuation structures on the deformable elements.

2. The actuator according to claim 1, wherein:
the at least one plurality of actuation structures is configured to cause a translation of the movable portion greater than a deformation of each of the plurality of deformable elements, each of the actuation structures includes a respective first piezoelectric region;
the deformable structure is monolithic, is substantially planar, and includes a semiconductor material layer;
the movable portion is adjacent to the plurality of deformable elements; and
the movable portion includes a first surface and each one of the plurality of deformable elements includes a second surface, and, when the movable portion and the plurality of deformable portions are at rest, the first surface and the second surface are aligned in a plane.

3. The actuator according to claim 1, wherein:
the deformable elements have a generally annular shape and surround the movable portion;
the at least one plurality of actuation structures is a first plurality of actuation structures being configured to deform the deformable structure and move the movable portion along a first direction; and
the actuator further comprises a second plurality of actuation structures, each of the actuation structures of the second plurality of actuation structures includes a second piezoelectric region, the second plurality of actuation structures being configured to deform the deformable structure and move the movable portion along a second direction.

4. The actuator according to claim 3, wherein:
the actuation structures of the first and the second pluralities of actuation structures are arranged alternately in succession on each of the deformable elements; and
the plurality of arms includes:
  first arms extending between the body and one of the plurality of deformable elements;
  second arms extending between adjacent ones of the plurality of deformable elements, the second arms couple ones of the first plurality of actuation structures on one of the plurality of deformable elements to ones of the second plurality of actuation structures on an adjacent one of the plurality of deformable elements; and
  third arms extending between one of the plurality of deformable elements and the movable portion.

5. The actuator according to claim 4, wherein the plurality of stiffening structures being supported by the deformable elements on an opposite side with respect to the actuation structures of the first plurality of actuation structures, each stiffening structure arranged at a central portion of a respective actuation structure of the first plurality of actuation structures.

6. The actuator according to claim 4, wherein:
the plurality of deformable elements includes a plurality of concentric rings; and
the actuation structures of the first and the second pluralities of actuation structures are formed by piezoelectric strips extending annularly and at a uniform mutual distance on each deformable element, each piezoelectric strip defining a curved median line having a center; and each arm of the plurality of arms is radially aligned with the center of one of the second plurality of actuation structures placed on a first deformable element of the plurality of deformable elements and with the center of one of the first plurality of actuation structures placed on a second deformable element of the plurality of deformable elements, the second deformable element being adjacent to and surrounded by the first deformable element.

7. The actuator according to claim 1, wherein:
the movable portion is a platform on and overlapping the cavity; and
the deformable structure includes a shutter structure having a region protruding from the movable portion.

8. The actuator according to claim 1, further comprising at least one detection structure on the deformable structure and wherein the at least one detection structure configured to detect the deformation of the deformable structure, and the at least one detection structure includes a respective first piezoelectric region.

9. The actuator according to claim 8, wherein:
each of the actuation structures of the at least one plurality of actuation structures includes a respective first stack of regions including a lower actuation electrode, a second piezoelectric region and an upper actuation electrode; and
the at least one detection structure includes a respective second stack of regions including a lower detection electrode, the first piezoelectric region and an upper detection electrode.

10. The actuator according to claim 9, further comprising a plurality of passivation regions, each passivation region surrounding a respective actuation structure of the at least one plurality of actuation structures.

11. A flow regulator, comprising:
a channel body;
a fluidic channel in the channel body and having an end portion;
a passage section adjacent to the end portion;
a microelectromechanical system (MEMS) actuator having a cavity, a body surrounding the cavity, and a deformable structure aligned with the cavity, the deformable structure including:
a movable portion having a surface facing the end portion and being configured to modify the passage section, which is arranged between the end portion and the movable portion;
a plurality of deformable elements surrounding the movable portion;
at least one plurality of actuation structures on the plurality of deformable elements; and
at least one detection structures on the plurality of deformable elements;
a control unit coupled to the MEMS actuator, the control unit configured to provide the at least one plurality of actuation structures with a bias voltage and to receive a detection voltage from the at least one detection structure.

12. The flow regulator according to claim 11, wherein when the movable portion is in a rest position, the end portion of the fluidic channel is in contact with the movable portion.

13. The flow regulator according to claim 11, wherein when the movable portion is in a rest position, the end portion of the fluidic channel is spaced apart from the movable portion by fluidic passage.

14. A speaker, comprising:
a shell delimiting a first cavity;
a diaphragm attached to the shell and on the cavity;
a MEMS actuator including a second cavity, a body surrounding the second cavity, and a deformable structure coupled to the diaphragm and configured to cause a deformation of the diaphragm, the deformable structure including:
a movable portion coupled to the diaphragm;
a plurality of deformable elements surrounding the movable portion;
at least one plurality of actuation structure on the plurality of deformable elements; and
at least one detection structure on the plurality of deformable elements;
a control unit coupled to the MEMS actuator and configured to provide the at least one plurality of actuation structures with a bias voltage and to receive a detection voltage from the at least one detection structure.

15. The speaker according to claim 14, wherein the plurality of deformable elements are arranged consecutively, surround the moveable portion, and connect the movable portion to the body.

16. A method of fabricating a MEMS actuator, comprising:
forming at least one plurality of actuation structures on a first surface of a substrate opposite to a second surface of the substrate; and
forming a deformable structure including:
forming a movable portion, forming a plurality of deformable elements arranged consecutively relative to each other and connecting one of the plurality of deformable elements to the movable portion, and forming a frame and connecting the frame to one of the plurality of deformable elements by forming a cavity extending into the second surface of the substrate.

17. The fabrication method according to claim 16, wherein forming the cavity further includes:
forming a plurality of shaping regions on the first surface of the substrate;
forming a stiffening layer and a structural layer on the plurality of shaping regions;
forming a plurality of trenches in the structural layer; and
selectively removing portions extending to the structural layer from the second surface of the substrate, wherein selectively removing the portions forms the cavity, a plurality of stiffening structures, the deformable structure and a shutter structure protruding from the structural layer towards the cavity.

18. The fabrication method according to claim 16, further comprising forming at least one detection structure on the deformable elements, the at least one detection structure including a respective second piezoelectric region.

19. The fabrication method according to claim 18, wherein:
forming the at least one plurality of actuation structures includes:
forming a plurality of lower actuation electrode regions from a first conductive layer;
forming a plurality of first piezoelectric regions on respective ones of the lower actuation electrode regions from a first piezoelectric layer; and
forming a plurality of upper actuation electrode regions on respective ones of the first piezoelectric regions from a second conductive layer; and forming the at least one detection structure includes:
- forming a lower detection electrode region from the first conductive layer;
- forming the respective second piezoelectric region on the lower detection electrode region from a second piezoelectric layer; and
- forming an upper detection electrode region on the respective second piezoelectric region, from a third conductive layer.

20. The fabrication method according to claim 19, wherein forming each one of the plurality of actuation structures includes:
- depositing the second piezoelectric layer and patterning the second piezoelectric layer forming the respective second piezoelectric regions; and
- surrounding respective ones of the at least one plurality of actuation structures with a respective passivation region by forming the respective passivation regions on corresponding ones of the respective second piezoelectric regions.

\* \* \* \* \*

UNITED STATES PATENT AND TRADEMARK OFFICE
CERTIFICATE OF CORRECTION

| | |
|---|---|
| PATENT NO. | : 11,981,558 B2 |
| APPLICATION NO. | : 17/240782 |
| DATED | : May 14, 2024 |
| INVENTOR(S) | : Domenico Giusti et al. |

It is certified that error appears in the above-identified patent and that said Letters Patent is hereby corrected as shown below:

In the Claims

Column 22, Claim 15, Line 23:
"the moveable portion,"
Should read:
--the movable portion,--.

Signed and Sealed this
Twenty-third Day of July, 2024

Katherine Kelly Vidal
*Director of the United States Patent and Trademark Office*